(12) United States Patent
Kang et al.

(10) Patent No.: US 7,065,869 B2
(45) Date of Patent: Jun. 27, 2006

(54) METHOD FOR PLATING OF PRINTED CIRCUIT BOARD STRIP

(75) Inventors: Tae-Hyeog Kang, Chungju-si (KR); Sang-Kab Park, Chungju-si (KR); Kwang-Ho Yoon, Seoul (KR); Bong-Kyu Choi, Chungju-si (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 330 days.

(21) Appl. No.: 10/360,106

(22) Filed: Feb. 7, 2003

(65) Prior Publication Data

US 2003/0150110 A1    Aug. 14, 2003

(30) Foreign Application Priority Data

Feb. 8, 2002  (KR) .................. 10-2002-0007533
Dec. 12, 2002 (KR) .................. 10-2002-0079215

(51) Int. Cl.
*H05K 3/02* (2006.01)

(52) U.S. Cl. .............................. 29/847; 29/415; 29/830; 29/846; 174/250; 361/784

(58) Field of Classification Search ............... 29/411, 29/412, 414, 415, 417, 825, 830–832, 593, 29/846, 847; 174/250, 257; 257/690–692, 257/698, 701, 702; 361/764, 784; 438/106, 438/108, 113, 114; 205/105; 428/812; 430/315, 430/320

See application file for complete search history.

(56) References Cited

U.S. PATENT DOCUMENTS

| 5,956,237 A | * | 9/1999 | Kohmura et al. ............ 361/784 |
| 6,091,026 A | * | 7/2000 | Yang .......................... 174/255 |
| 6,319,750 B1 | * | 11/2001 | Huang et al. ............... 438/106 |

* cited by examiner

*Primary Examiner*—Minh Trinh
*Assistant Examiner*—Donghai D. Nguyen
(74) *Attorney, Agent, or Firm*—Gottlieb, Rackman & Reisman, P.C.

(57) ABSTRACT

Disclosed is a design method for plating of a printed circuit board (PCB) strip, in which a main plating line is optionally formed on a component side, a solder side, or an inner layer of the PCB strip by modifying a sub-plating line of the PCB strip used to manufacture a semiconductor chip package, and a method of manufacturing the semiconductor chip package using the same. Therefore, an excellent semiconductor chip package is manufactured without a short when the PCB strip is cut using a sawing machine because misalignment of main plating lines of the solder side and the component side of the PCB strip is avoided, and an interval between PCB units is reduced to desirably increase the number of PCB units in the PCB strip without the short when the PCB strip is cut.

19 Claims, 28 Drawing Sheets

US 7,065,869 B2

METHOD FOR PLATING OF PRINTED CIRCUIT BOARD STRIP

BACKGROUND OF THE INVENTION

1. Field of the Invention

The present invention pertains to a design method for plating of a printed circuit board (PCB) strip and a manufacturing method of a semiconductor chip package using the same. More particularly, the present invention relates to a design method for plating of a printed circuit board strip, in which a main plating line is optionally formed on a component side, a solder side, or an inner layer of the PCB strip by modifying a sub-plating line of the PCB strip used to manufacture a semiconductor chip package, and the semiconductor chip package manufactured using the same.

2. Description of the Prior Art

Being able to cope with performance of a semiconductor chip with high density input and output pins such as IC (integrated circuit) and LSI (large scale integrated circuit), a PCB strip is applied to a semiconductor chip package in which balls or pins acting as an input and output means are formed on a bottom side of the semiconductor chip package, such as a ball grid array package, a pin grid array package, and a chip size package.

With reference to FIG. 1, a plurality of PCB units 20 each provided with a component side and a solder side are arranged at regular intervals on a PCB strip 10. For example, fourteen PCB units are arranged on the PCB strip with a size of 220 mm 60 mm. At this time, a distance X between the PCB units is about 250 μm to 350 μm.

Recently, the semiconductor chip package is applied to various electronic goods, communication equipments, and computers, thus allowing them to have multi- and newest-functions. Further, in accordance with the recent trend of mass production of the semiconductor chip package, there remains a need to reduce an interval between the PCB units to increase the number of PCB units in the PCB strip as shown in FIG. 2.

Referring to FIG. 2, the interval Y between the PCB units is about 180 μm, which is shorter than the interval X in FIG. 1. However, a high technology is needed to reduce the interval between the PCB units, and when the improved PCB strip in which the interval between the PCB units is reduced is divided into individual PCB units, a short occurs in a printed circuit pattern due to misalignment of a component side with a solder side, thereby undesirably reducing productivity due to an increase in the number of inferior semiconductor chip packages.

A conventional process of manufacturing a semiconductor chip package comprises plating desired portions of a PCB strip through a main plating line formed on a component or a solder side of the PCB strip, mounting a semiconductor chip on the component side, wire-bonding the resulting structure, cutting reed lines protruded from the solder side, soldering the solder side, and dividing the resulting PCB strip into individual PCB units using a sawing machine. At this time, the diameter of the sawing machine is about 200 μm, and the PCB strip is cut along the main plating line on the solder side.

In the case of the PCB strip of FIG. 1, because the interval between the individual PCB units is broad, a few PCB units are arranged in one strip, so the short of the printed circuit pattern on the component side is not critical even though the PCB strip is cut by the conventional sawing machine. However, if the interval between individual PCB units is reduced as shown in FIG. 2, occurrence of short circuit is undesirably increased when the PCB strip 10 is cut along the main plating line 30 on the solder side using the conventional sawing machine.

Referring to FIGS. 4 and 5, an enlarged view of a portion A of FIG. 2 illustrating the solder side 12 of the PCB strip in which an interval between the PCB units is reduced to desirably increase the number of PCB units in the PCB strip, and another enlarged view of a portion B of FIG. 3 illustrating the component side 14 of the PCB strip of FIG. 2 are shown, respectively.

As in FIG. 4, a solder ball part 60 on which a solder ball is to be formed is plated with Au through a first plating line 32 connected to a first main plating line 30 of the solder side 12 of the PCB strip. Further, an isolated solder ball part 61 which is not connected to the first main plating line 30 or the first plating line 32 is plated through a second main plating line 70 of the component side 14 of FIG. 5 and a via land 50 placed on a copper-clad part 40 of the component side 14 corresponding in position to the isolated solder ball part 61.

Furthermore, a first bond finger part 81, which is subjected to a wire-bonding, on the component side 14 of the PCB strip is plated with Au through a second plating line 72 connected to the second main plating line 70. Additionally, an isolated bond finger part 82 is plated with Au through the via land 50 positioned on the copper-clad part 40 of the solder side corresponding in position to the isolated bond finger part 82.

With reference to FIG. 6, the PCB strip provided with the component side of FIG. 5 and the solder side of FIG. 4 is illustrated. In detail, FIG. 6 is an enlarged view of the PCB strip of which an upper side, forming the component side of FIG. 5 is overlapped on a lower side thereof forming the solder side of FIG. 4. Additionally, FIG. 7 is a schematic side view of the PCB strip illustrating misalignment of the component side from the solder side, FIG. 8 is an X-ray picture of the PCB strip in which misalignment of the component side from the solder side is formed, and FIG. 9 is an X-ray picture of the PCB strip without misalignment of the component side from the solder side.

As described above, the soldered PCB strip is cut along the first main plating lines 30 of the solder side 12 using the conventional sawing machine. However, when a width of a cut part 90 of the PCB strip is about 200 μm and the PCB strip is cut along the first main plating lines 30 of the solder side 12 using a blade, as shown in FIG. 7 illustrating the side view of the PCB strip and the X-ray picture of FIG. 8, a short 100 occurs on the component side. Accordingly, any misalignment should be avoided between the component side and the solder side so that the second main plating line 70 of the component side completely or partially accords with the first main plating line 30 of the solder side to prevent the short of the printed circuit pattern, as shown in FIG. 9. However, a very high-leveled technology is needed to avoid the misalignment of the component side from the solder side, and conventional efforts are not sufficiently effective.

SUMMARY OF THE INVENTION

Therefore, the present invention has been made keeping in mind the above disadvantages occurring in the prior arts, and an object of the present invention is to provide a design method for plating of a PCB strip used to manufacture semiconductor chip packages without a short due to misalignment of a solder side from a component side when the PCB strip is cut.

It is another object of the present invention to minimize fabrication of inferior semiconductor chip packages by optionally forming a main plating line on a solder side, a component side, or an inner layer when one or more inner layer is inserted between the solder side and the component side of a PCB strip to avoid misalignment of the solder side from the component side.

It is still another object of the present invention to provide an excellent semiconductor chip package and a method of manufacturing the same using the design method for plating of the PCB strip of the present invention.

The above objects can be accomplished by providing a design method for plating of a PCB strip having a plurality of PCB units, comprising forming a main plating line on any one of a solder side and a component side between adjacent PCB units. The PCB units each includes the component side allowing a semiconductor chip to be mounted thereon and having a bond finger part and first copper-clad parts for constructing a first circuit pattern, and the solder side having second copper-clad parts for constructing a second circuit pattern and solder ball parts provided on the second copper-clad parts for receiving solder balls thereon. At this time, the first copper-clad parts includes conductive via lands, and the bond finger part is wire-bonded to the first copper-clad parts. Additionally, the second copper-clad parts includes the conductive via lands, and the solder balls are melted and attached to the solder ball parts of the second copper-clad parts.

Moreover, the present invention provides a design method for plating of a PCB strip having a plurality of PCB units, comprising forming a main plating line on any one of a solder side, a component side, and an inner layer between adjacent PCB units. The PCB unit includes the component side allowing a semiconductor chip to be mounted thereon and having a bond finger part and first copper-clad parts for constructing a first circuit pattern, and the solder side having second copper-clad parts for constructing a second circuit pattern and solder ball parts provided on the second copper-clad parts for receiving solder balls thereon. At this time, the first copper-clad parts includes conductive via lands, and the bond finger part is wire-bonded to the first copper-clad parts. Additionally, the second copper-clad parts includes the conductive via lands, and the solder balls are melted and attached to the solder ball parts of the copper-clad parts. The PCB unit also includes one or more inner layers inserted between the component side and the solder side. The inner layer has drill holes connected to the conductive via lands of a third copper-clad part and the sub-plating line connected to the third copper-clad parts thereon.

Further, the present invention provides a manufacturing method of a semiconductor chip package, comprising providing a strip having a component side and a solder side, half-etching the strip at a low temperature for a short time to allow the strip to have a uniform etched surface and a constant thickness, drilling the etched strip to form a plurality of holes at desired positions of the strip, horizontally plating the drilled strip, designing a circuit pattern of the plated strip, printing the designed circuit pattern on the plated strip to form a PCB strip, plating the PCB strip with gold, routing the gold-plated PCB strip to form a plurality of grooves on the gold-plated PCB strip, and inspecting the resulting PCB strip.

Furthermore, the present invention provides a manufacturing method of a semiconductor chip package, comprising providing a printed circuit board strip (PCB strip) comprising a component side and a solder side, with a plurality of printed circuit board units (PCB units) arranged at regular intervals on the PCB strip and a main plating line optionally formed on the solder side or the component side. At this time, the component side have a bond finger part wire-bonded to first copper-clad parts for constructing a first circuit pattern, and the solder side have second copper-clad parts for constructing a second circuit pattern. Additionally, the solder ball parts are provided on the second copper-clad parts for receiving solder balls thereon, and the solder balls are melted and attached to the solder ball parts. The first and second copper-clad parts include conductive via lands. The manufacturing method also includes plating the solder ball parts of the solder side and the bond finger part of the component side through the main plating line or each of the via lands, mounting semiconductor chips on the component side of the plated PCB strip and wire-bonding the semiconductor chips to the PCB strip, trimming leads of the solder side and soldering the leads to the solder side, and cutting the resulting PCB strip along the main plating line of the solder side or the component side using a sawing machine without a short due to misalignment of the solder side from the component side.

It is yet another object of the present invention to provide a semiconductor chip package manufactured by the method of manufacturing the semiconductor chip package using the design method for plating of the PCB strip.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
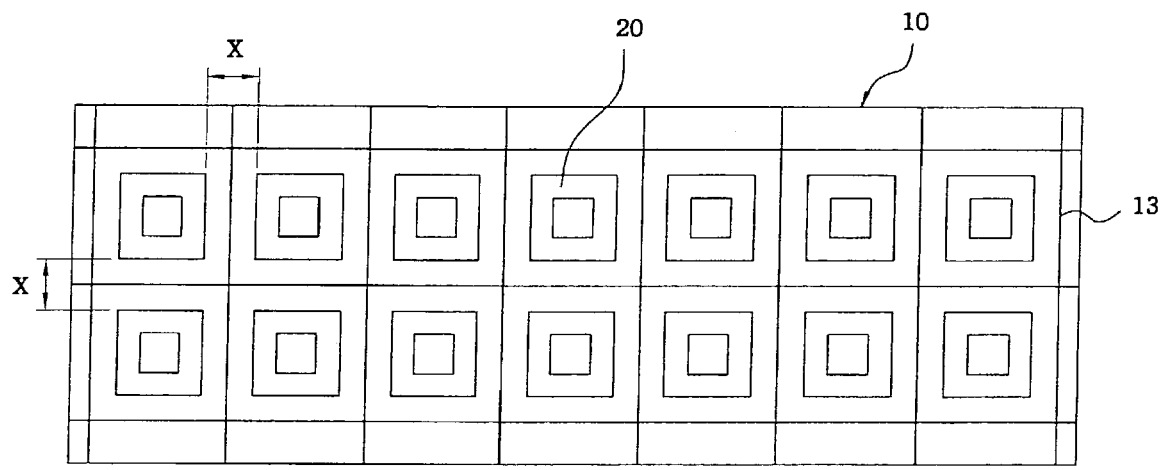
FIG. 1 is a view schematically illustrating a conventional PCB strip comprising a plurality of PCB units arranged at regular intervals.

Reference now should be made to the drawings, in which the same reference numerals are used throughout the different drawings to designate the same or similar components.

Figure 10:
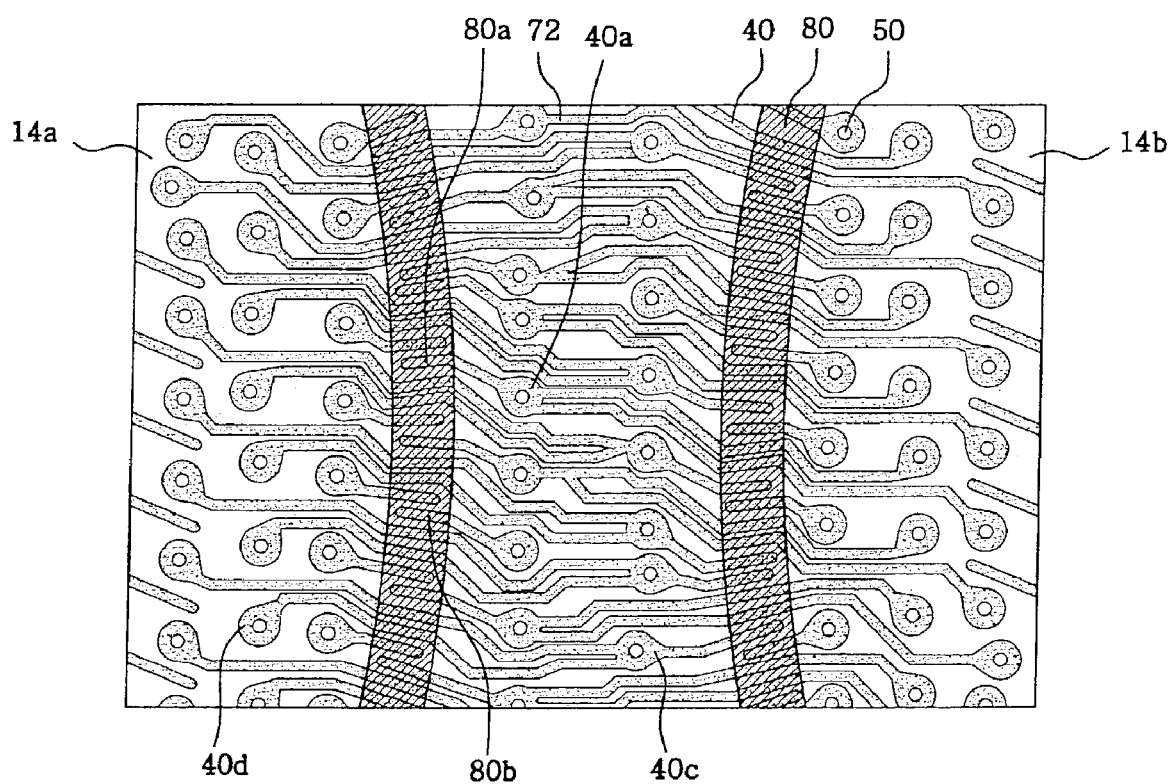
FIG. 10 is an enlarged view of a component side of a PCB strip according to an embodiment of the present invention.
Figure 11:
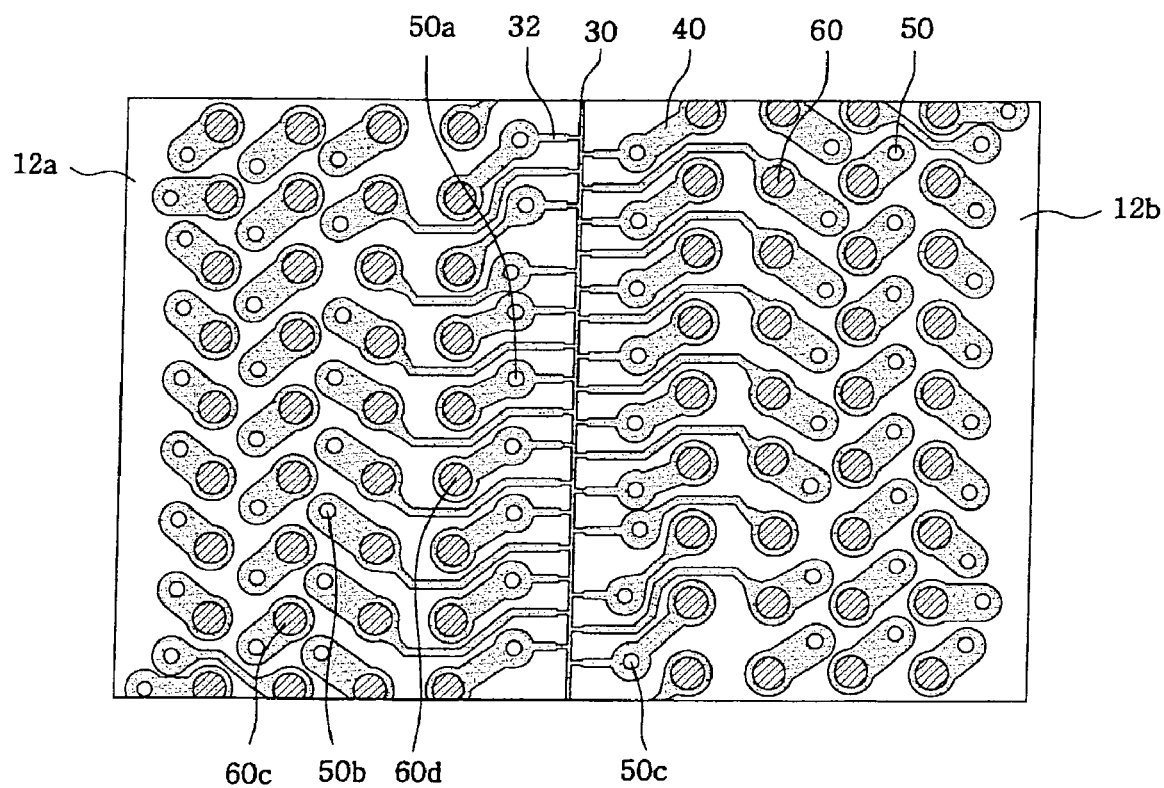
FIG. 11 is an enlarged view of a solder side of the PCB strip according to an embodiment of the present invention.

FIG. 10 illustrates sub-plating lines of a component side of a PCB strip according to an embodiment of the present invention, in which a main plating line is removed, and FIG. 11 illustrates sub-plating lines of a solder side of the PCB strip, in which a main plating line is shown.

In the PCB strip according to the present invention, a plurality of PCB units are arranged at regular intervals like a conventional PCB strip.

Each PCB unit comprises the component side and the solder side. The component side is provided with a copper-clad part for constructing a circuit pattern, a bond finger part on which a wire bonding is to be conducted, and a semiconductor chip mounted thereon. Additionally, the solder side is a backside of the component side, and is provided with the copper-clad part for constructing the circuit pattern, and a solder ball part for receiving a solder ball. At this time, the solder ball is melted and attached to the solder ball part of the copper-clad part. As described above, in FIGS. 10 and 11, the main plating line is not formed on the component side, but formed on the solder side. Furthermore, a conductive via land is formed on each copper-clad part.

As in FIG. 10, adjacent PCB units are connected to each other through sub-plating lines. In other words, the sub-plating line in one PCB unit is not connected to the main plating line, but is connected to the copper-clad part, in which the conductive via land is formed, in the other PCB unit. At this time, it is preferable to connect the sub-plating line to its closest copper-clad part.

Accordingly, the solder ball part on the solder side is plated through the main plating line of the solder side, the bond finger part of the component side is plated through the via land of the solder side, and the isolated solder ball part is plated through the via land of the component side, because the main plating line is not formed on the component side of the PCB strip according to the present invention unlike a conventional PCB strip. At this time, the copper-clad part positioned at the outermost border of the PCB strip is connected to the main plating line.

As in FIGS. 10 and 11, for example, the bond finger part 80a on the component side of the PCB strip is plated with Au through the main plating line 30 and the via land 50a of the solder side, and the copper-clad part 40a of the component side.

Further, the isolated bond finger part 80b is plated with Au through the main plating line 30 and the via land 50b of the solder side.

Furthermore, the solder ball part 60d on the solder side of the PCB strip is plated with Au through the main plating line 30 of the solder side, as shown in FIG. 11.

On the other hand, the isolated solder ball part 60c is plated with Au through the main plating line 30 and the via land 50c of the solder side, and the copper-clad part 40c, 40d of the component side.

Figure 2:
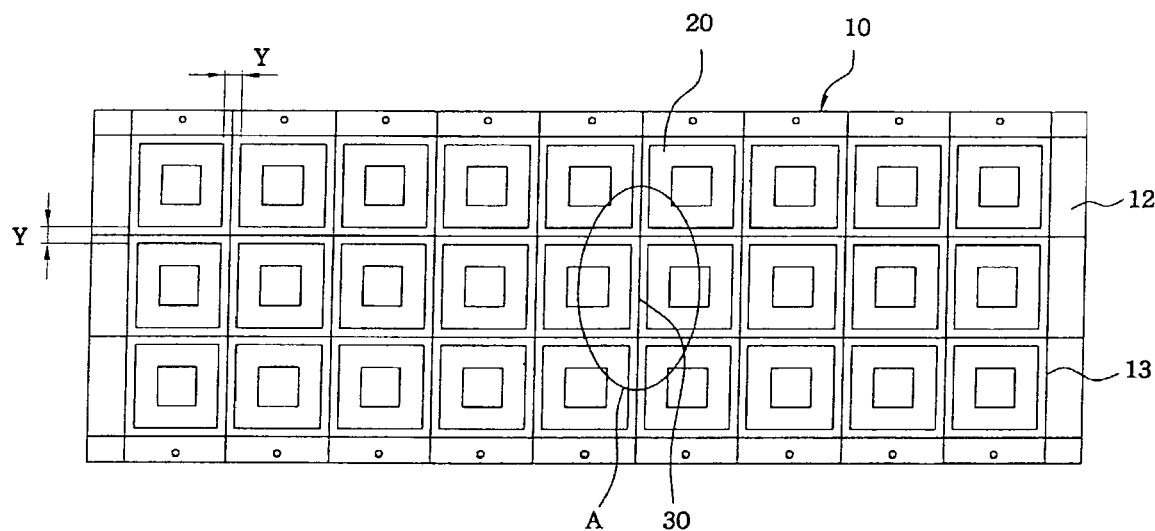
FIG. 2 is a view schematically illustrating a lower side (solder side) of a PCB strip in which an interval between PCB units is reduced to desirably increase the number of PCB units in the PCB strip.
Figure 3:
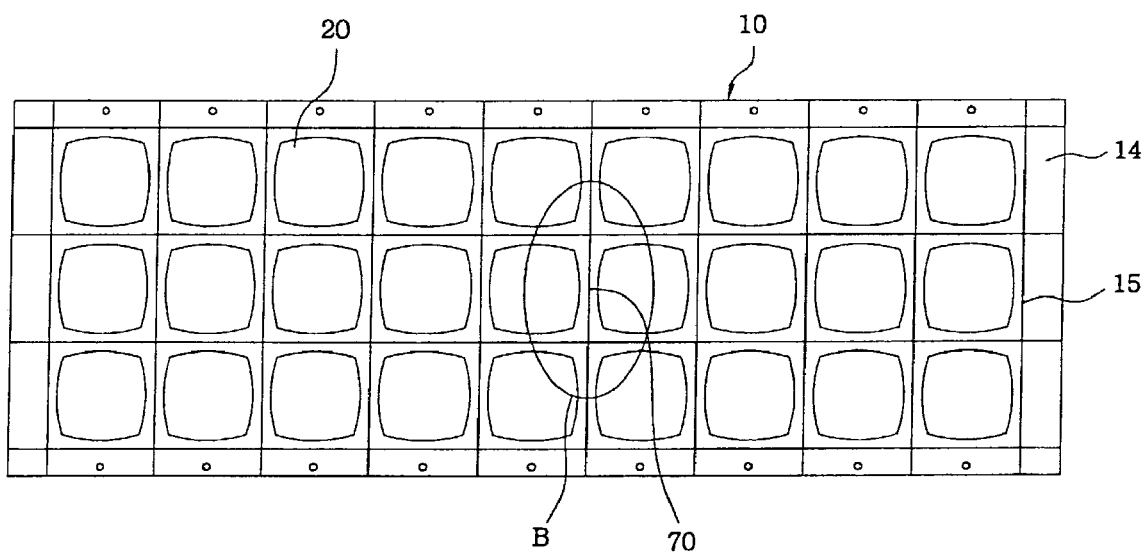
FIG. 3 is a view schematically illustrating an upper side (component side) of the PCB strip of FIG. 2.
Figure 4:
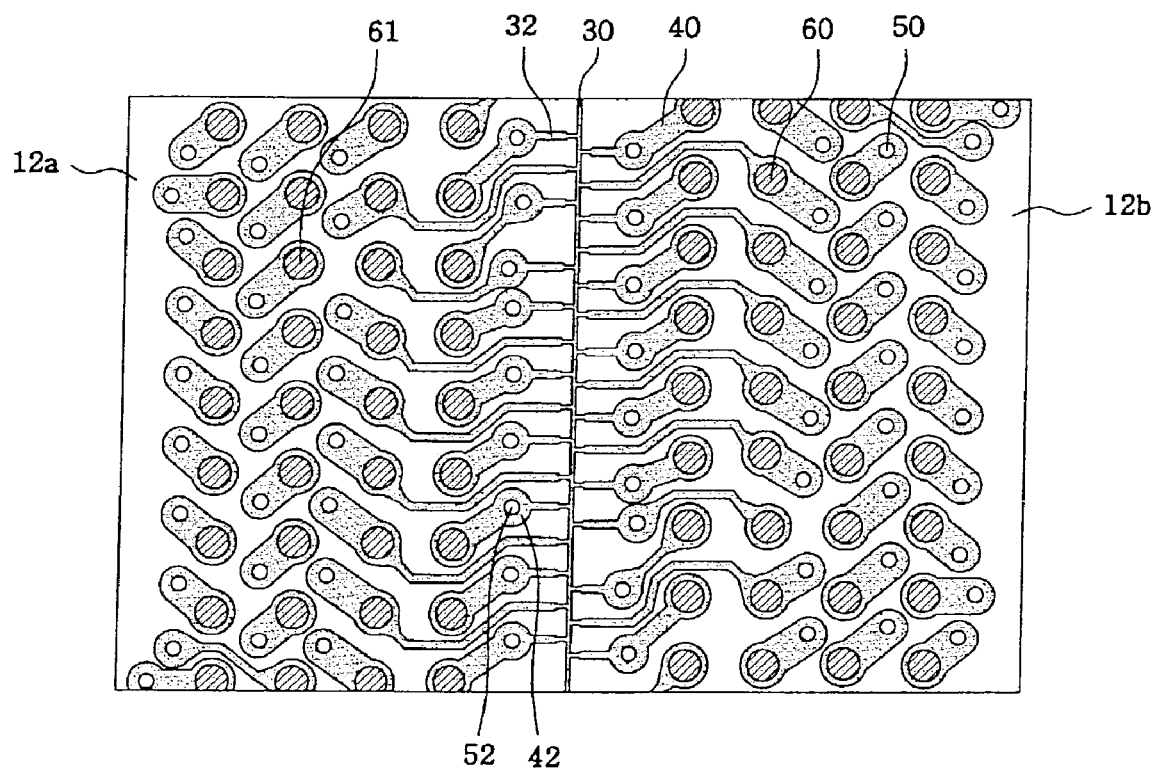
FIG. 4 is an enlarged view of the portion A of the solder side of the PCB strip in FIG. 2.
Figure 5:
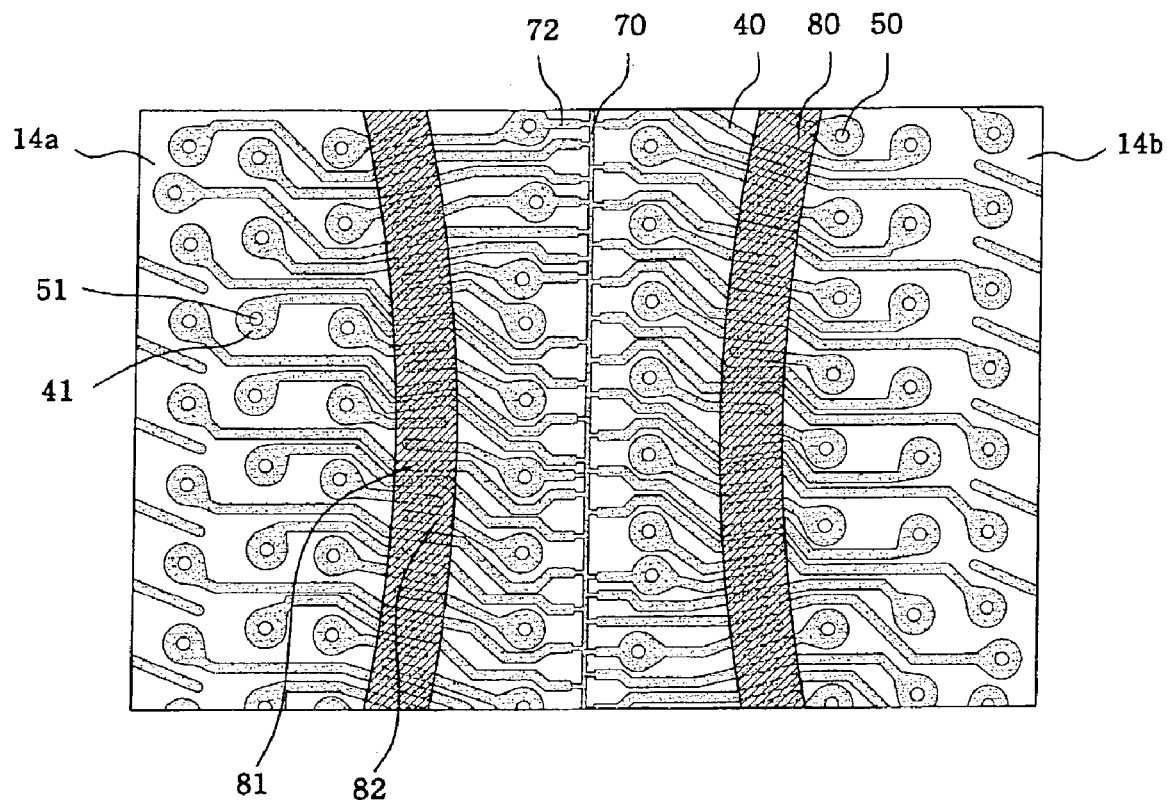
FIG. 5 is an enlarged view of the portion B of the component side of the PCB strip in FIG. 3.
Figure 6:
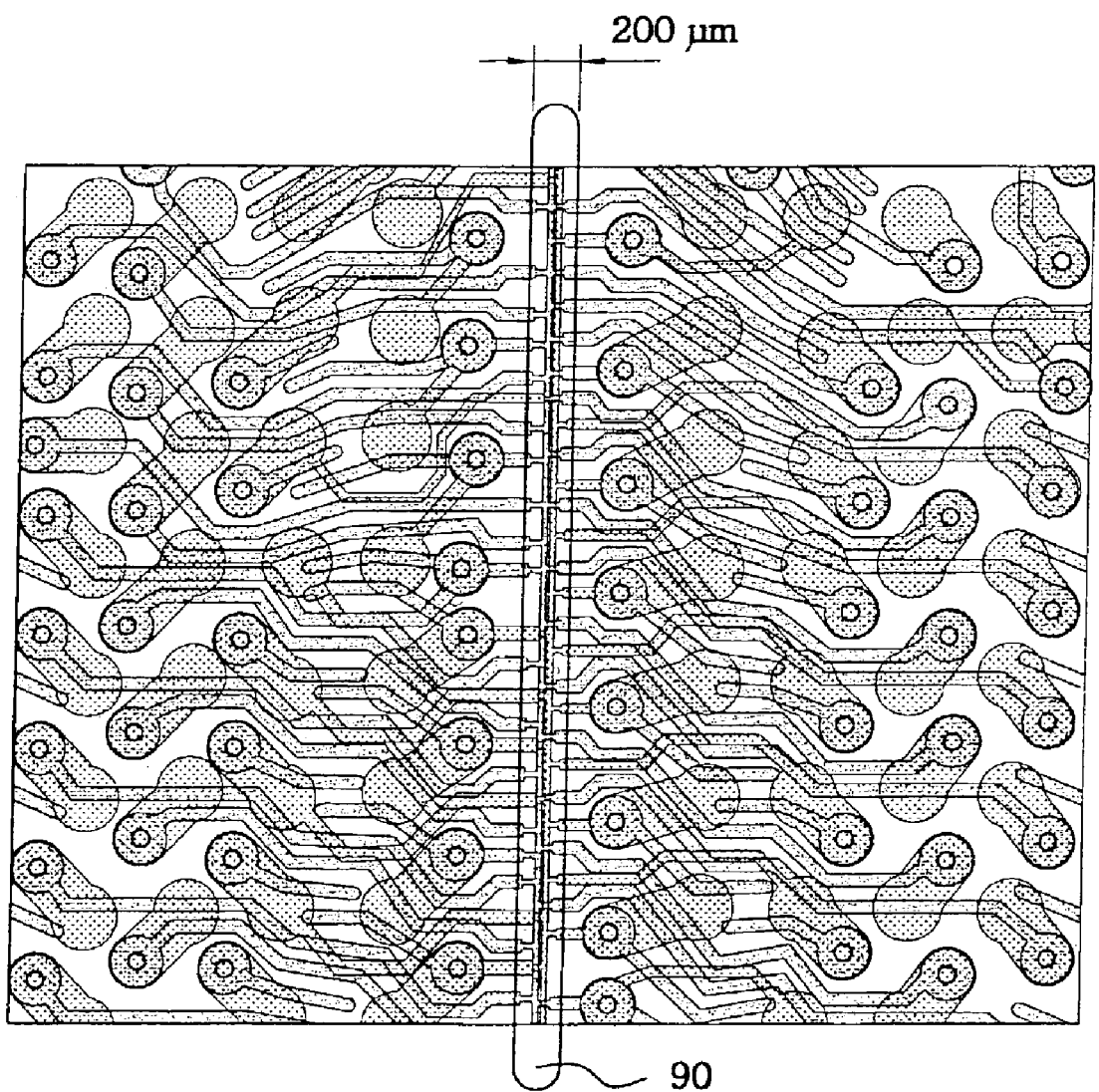
FIG. 6 is an enlarged view of the PCB strip in which the upper side (component side) of the PCB strip of FIG. 5 is overlapped on the lower side (solder side) of the PCB strip of FIG. 4.

Meanwhile, it is preferable that an copper-clad part 13 (shown in FIG. 2) at the outermost border of the PCB strip is certainly connected to the main plating line 30 even though not shown in FIGS. 10 and 11.

If the PCB strip is designed according to the above description, the PCB strip is desirably plated and a short does not occur when the PCB strip is cut along the main plating line of the solder side using a conventional sawing machine even though the main plating line is not formed on the component side, but is formed on the solder side.

Figure 7:
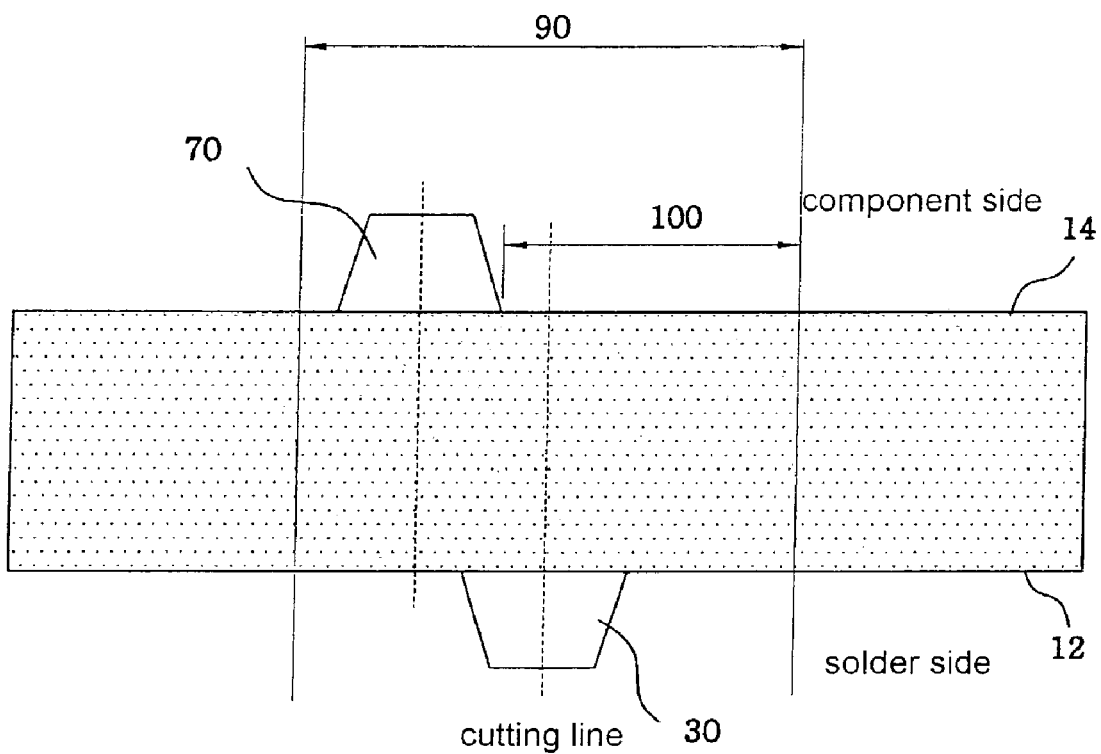
FIG. 7 is a schematic side view of the PCB strip illustrating misalignment of the component side from the solder side.
Figure 8:
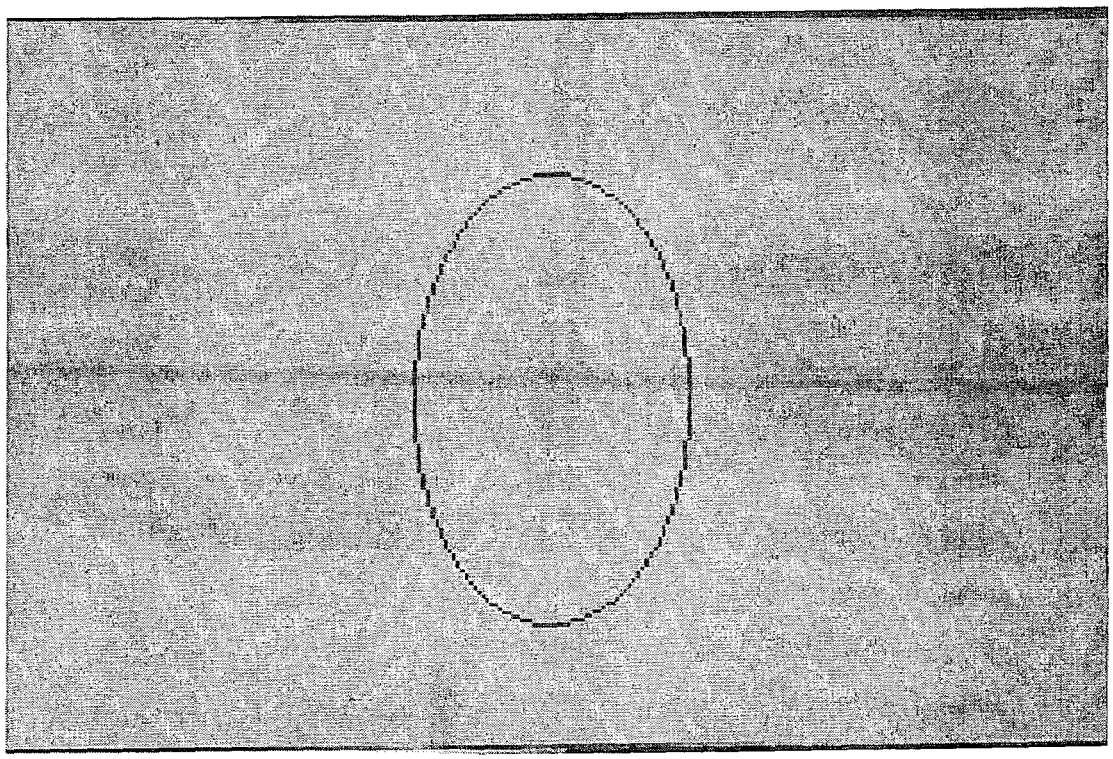
FIG. 8 is an X-ray picture of the PCB strip in which misalignment of the component side from the solder side is formed.
Figure 9:
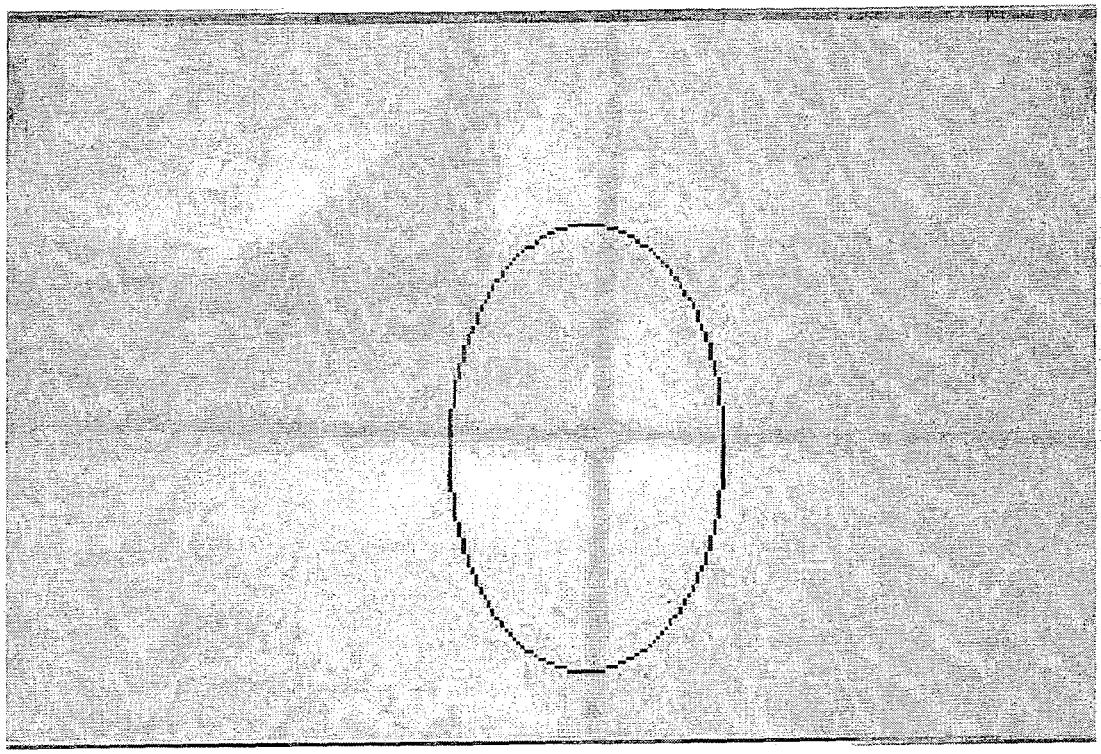
FIG. 9 is an X-ray picture of the PCB strip without misalignment of the component side from the solder side.
Figure 12:
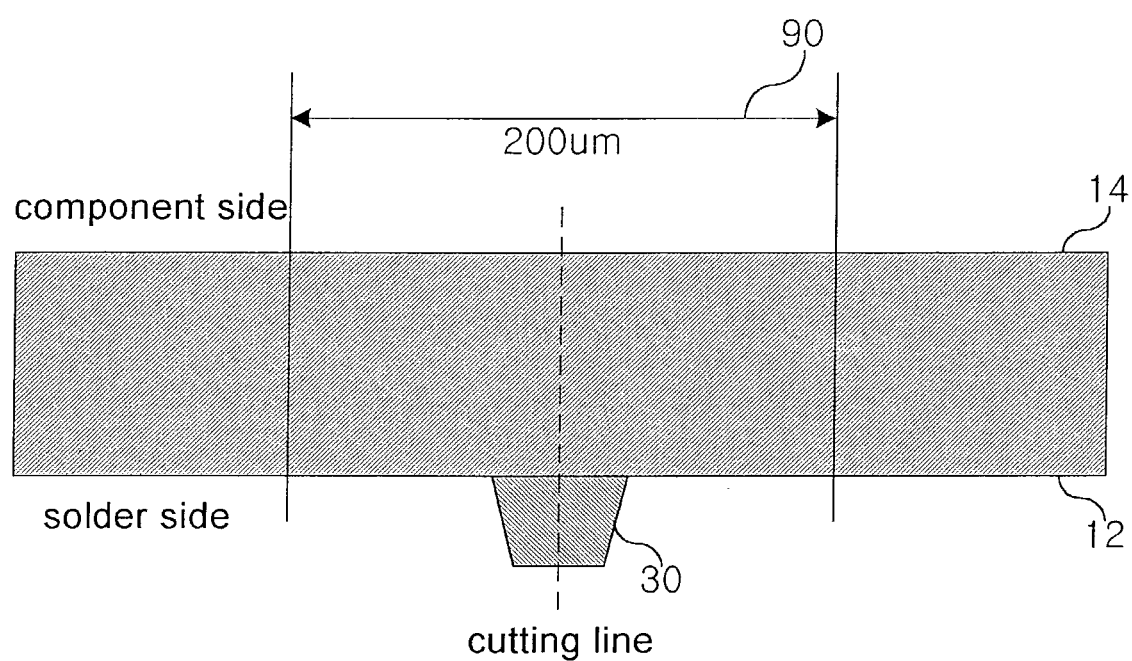
FIG. 12 is a schematic side view of the PCB strip of FIGS. 10 and 11.

This will be apparent to those skilled in the art from FIG. 12. Unlike a conventional PCB strip as shown in FIG. 7, the PCB strip, as shown in FIG. 12, according to the present invention has the main plating line on the solder side, so the short does not occur on the component side even though the PCB strip is cut using the conventional sawing machine with a width of 200 μm.

In the case of the PCB strip of the present invention, a semiconductor chip is manufactured without occurrence of the short even though an interval between adjacent PCB units is reduced such that the interval is 200 μm or less.

Figure 13:
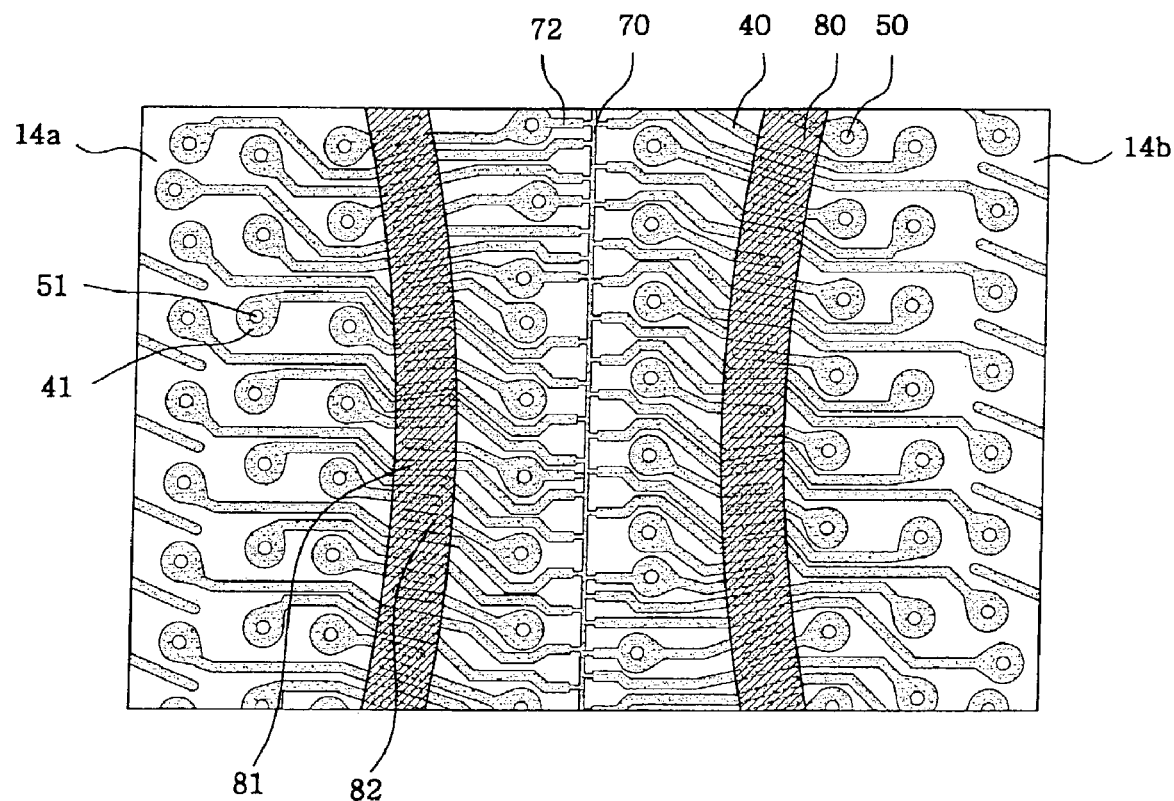
FIG. 13 is an enlarged view of a component side of a PCB strip according to another embodiment of the present invention.
Figure 14:
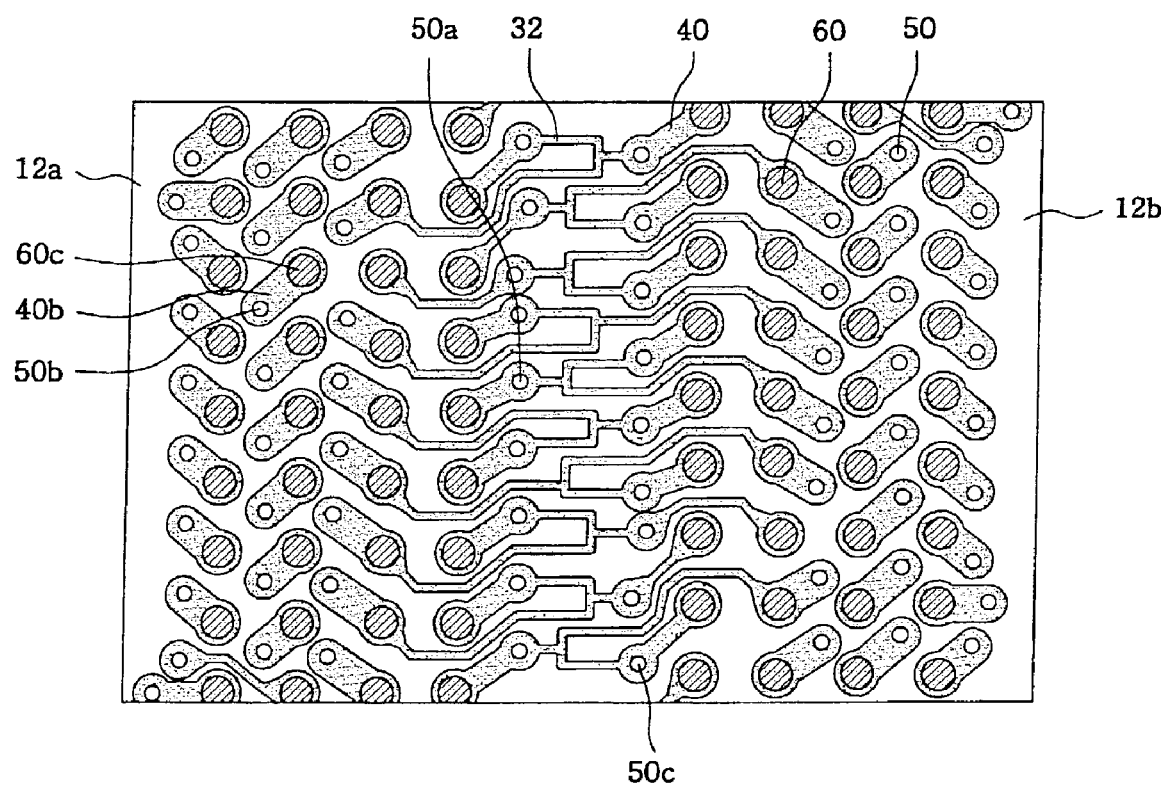
FIG. 14 is an enlarged view of a solder side of the PCB strip according to another embodiment of the present invention.
Figure 15:
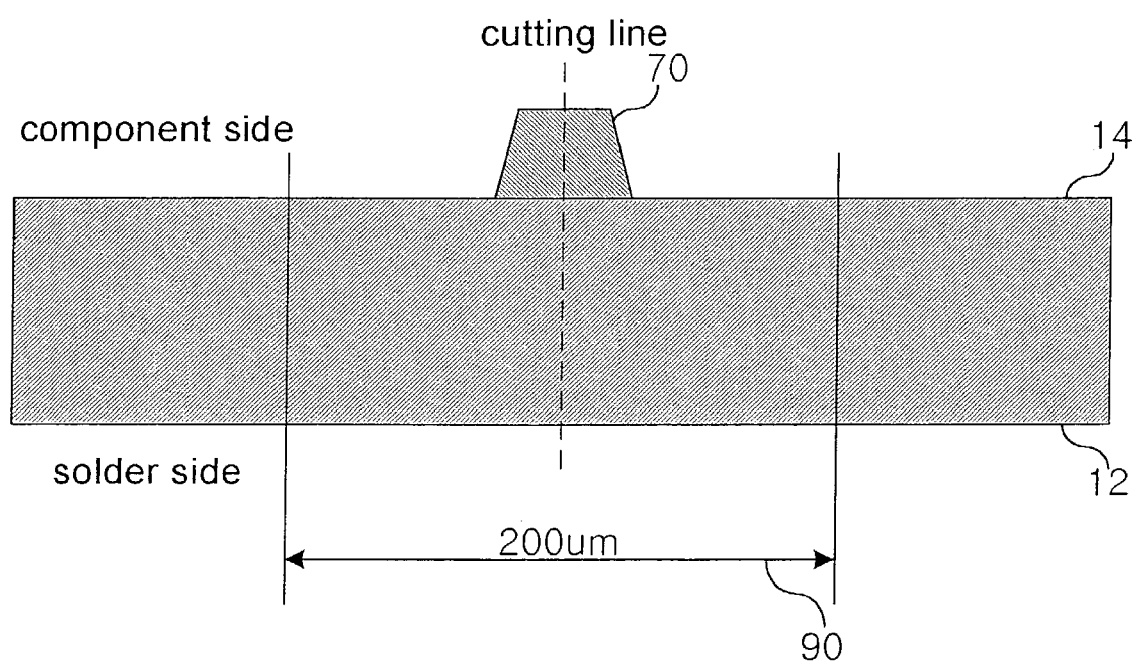
FIG. 15 is a schematic side view of the PCB strip of FIGS. 13 and 14.

Referring to FIGS. 13 and 14, the main plating line is not formed on the solder side but formed on the component side. At this time, the copper-clad part 40 on which the conductive via land 50 is formed is connected through sub-plating lines 72 to the main plating line, thereby accomplishing a plating process of the bond finger part 80.

However, the main plating line is not formed on the solder side, so the copper-clad part in which the conductive via land 50 is formed between adjacent PCB units 12a and 12b is connected to sub-plating lines 32. Accordingly, the solder ball 60 is plated through the main plating line 70 of the component side, the copper-clad part 40 including the conductive via land 50, and the sub-plating lines 32.

In other words, the bond finger part 81, on which is to be subjected to a wire bonding, of the component side is plated with Au through the main plating line 70 of the component side and the sub-plating line 72 connected to the main plating line 70. Additionally, the isolated bond finger part 82 is plated with Au through the main plating line 70 and the via land 50 of the component side, and the via land 50 of the solder side 12 corresponding to the copper-clad part 40 of the solder side 12.

Moreover, adjacent PCB units 12a and 12b of the solder side 12 of the PCB strip are connected by the sub-plating line 32, and the solder ball part 60 on which the solder ball is to be formed is plated with Au through the main plating line 70 of the component side 14, the sub-plating line 72 connected to the main plating line 70, and the via land 50 positioned in the copper-clad part 40 of the solder side corresponding in position to the via land 50 of the component side. Furthermore, the isolated solder ball part 60c is plated with Au through the main plating line 70 and the sub-plating line 72 of the component side 14, the copper-clad part 41 including the via land 51, the via land 50b and the copper-clad part 40b of the solder side 12.

If the PCB strip is designed according to the above description, the PCB strip is desirably plated and a short does not occur when the PCB strip is cut along the main plating line of the solder side using a conventional sawing machine even though the main plating line is not formed on the component side but on the solder side.

This will be apparent to those skilled in the art from FIG. 12. Unlike the conventional strip as shown in FIG. 7, the PCB strip, as shown in FIG. 12, according to the present invention has the main plating line on the solder side, so the short does not occur on the component side even though the PCB strip is cut using the conventional sawing machine with a width of 200 μm.

In the case of the PCB strip of the present invention, a semiconductor chip is manufactured without the short even though an interval between adjacent PCB units is reduced such that the interval is 200 μm or less.

In order to plate the PCB strip according to the above description, the PCB strip has the component and solder sides.

Figure 16:
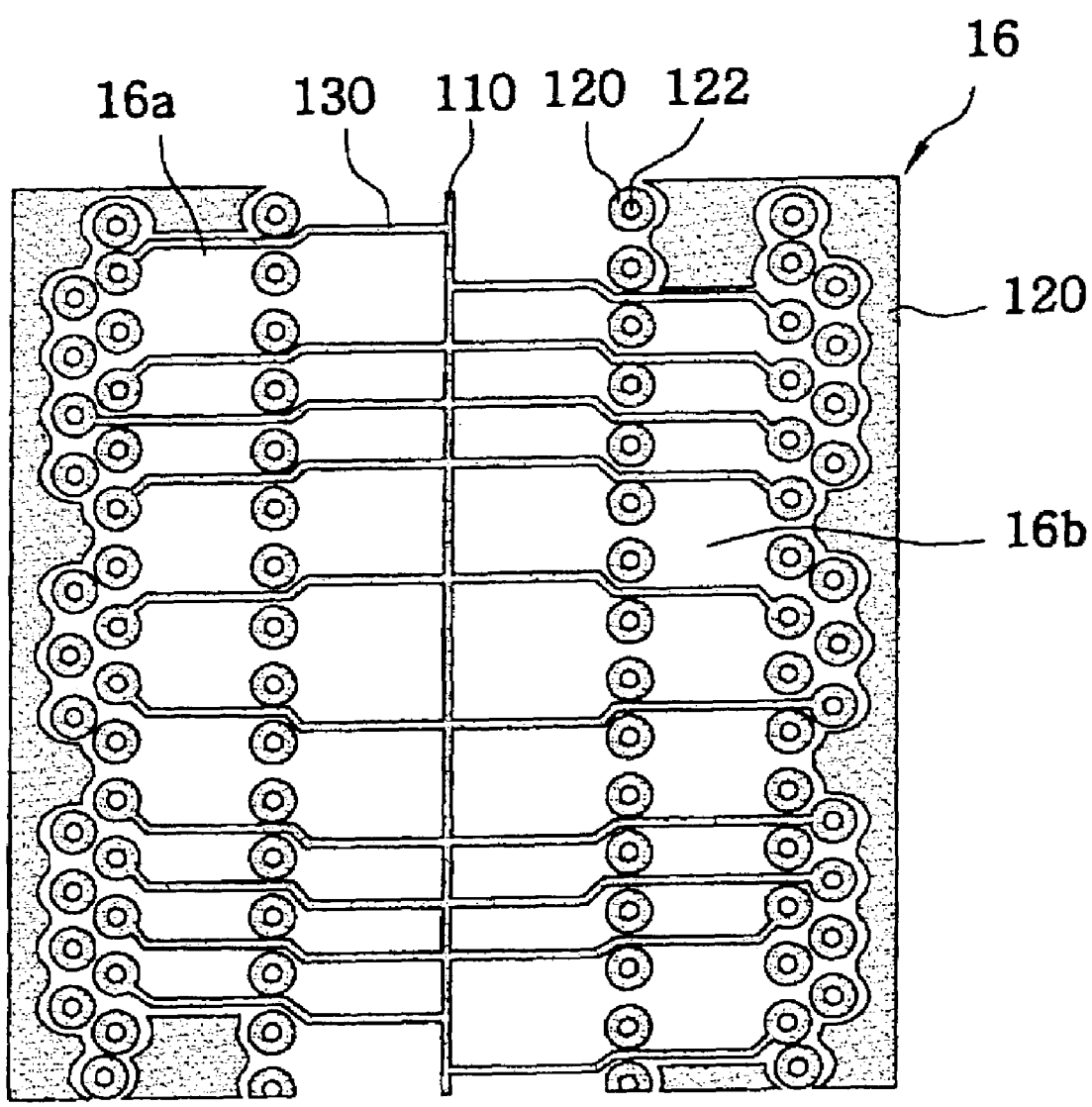
FIGS. 16 and 18 are enlarged views of an inner layer of a PCB strip of the present invention from which a main plating line is formed.

Turning now to FIG. 16, a semiconductor chip package comprising one or more inner layers between the component side and the solder side is illustrated, which is not easily designed and plated using a conventional pattern of the component and solder side. In other words, the inner layer is inserted between the component side and the solder side, and the via land of the inner layer 16 may be preferably formed to correspond to the component and solder sides and may be correspond in position to any one of the via lands of the component side and the solder side.

Moreover, the present invention provides a design method for plating of a PCB strip having a plurality of PCB units, comprising forming a main plating line on any one of a solder side, a component side, and an inner layer between adjacent PCB units. The PCB unit includes the component side allowing a semiconductor chip to be mounted thereon and having a bond finger part and first copper-clad parts for constructing a first circuit pattern, and the solder side having second copper-clad parts for constructing a second circuit pattern and solder ball parts provided on the second copper-clad parts for receiving solder balls thereon. At this time, the first copper-clad parts includes conductive via lands, and the bond finger part is wire-bonded to the first copper-clad parts. Additionally, the second copper-clad parts includes the conductive via lands, and the solder balls are melted and attached to the solder ball parts of the copper-clad parts. The PCB unit also includes one or more inner layers inserted between the component side and the solder side. The inner layer has drill holes connected to the conductive via lands of a third copper-clad part and the sub-plating line connected to the third copper-clad parts thereon.

Figure 17:
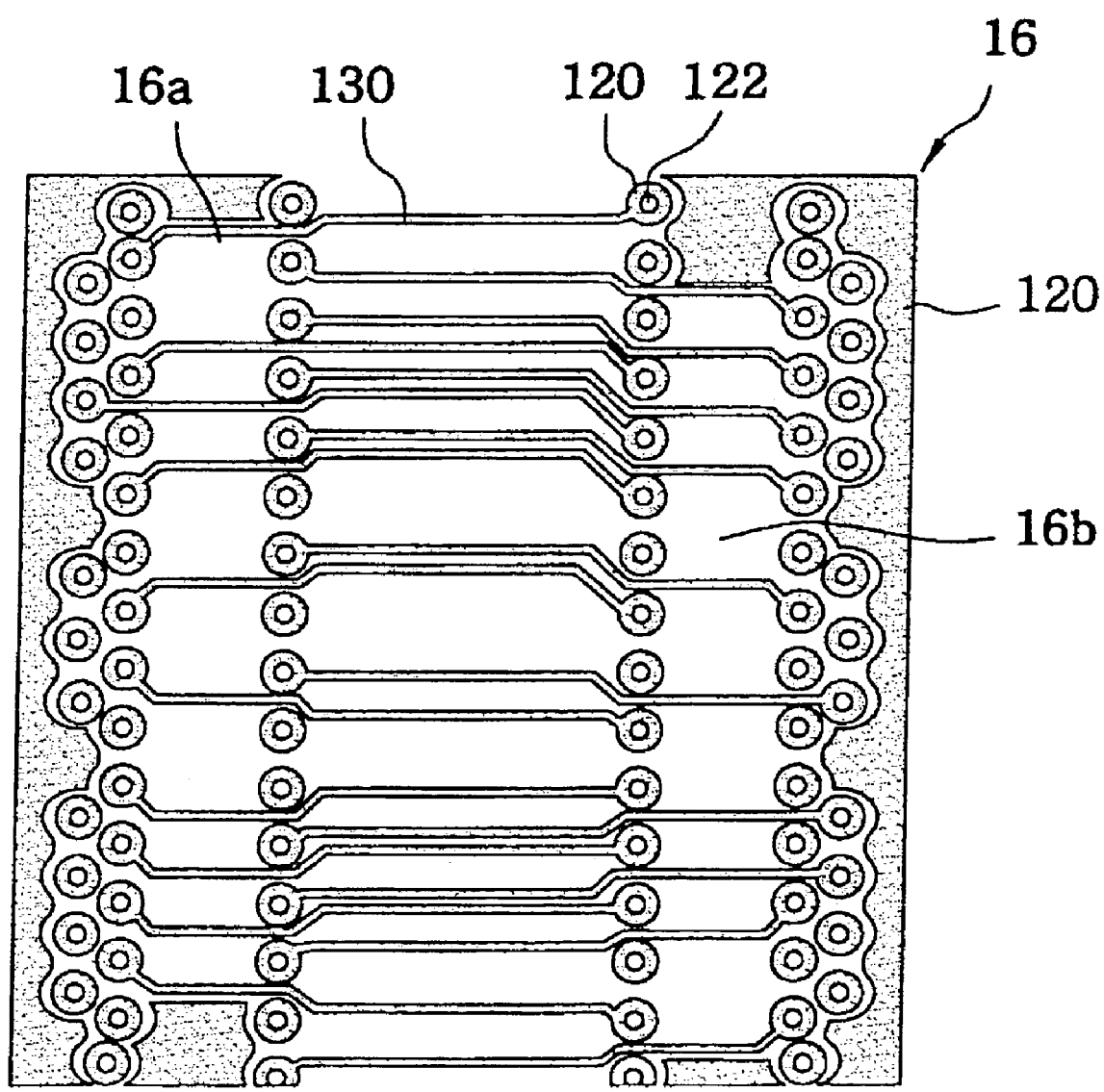
FIGS. 17 and 19 are enlarged views of the inner layer of the PCB strip of the present invention from which the main plating line is removed.

As described above, the main plating line 110 may be formed on the inner layer 16 between the PCB units 16a and 16b as shown in FIG. 16, but may be not formed on the inner layer 16 between the PCB units 16a and 16b as shown in FIG. 17. In FIG. 16, the inner layer is plated through the main plating line 110, the sub-plating line 130, and the copper-clad part 120 including the conductive via land 122.

At this time, there are three cases: a first case in which the main plating line is not formed on the component side and solder side but on the inner layer, a second case in which the main plating line is not formed on the component side and inner layer but on the solder side, and a third case in which the main plating line is not formed on the inner layer and solder side but on the component side. To be sure, the main plating line is formed on any one of the component side, the solder side, and the inner layer, and the copper-clad part connected to the main plating line is formed at the outermost border of any one of the component side, the solder side, and the inner layer even though one or more inner layer is inserted between the component side and the solder side.

When the main plating line is formed on any one of the component side, the solder side, and the inner layer, the bond finger part of the component side and the solder ball part of the solder side are easily plated with Au through the main plating line, sub-plating lines connected to the main plating line, and the copper-clad part including the conductive via land and each formed on the component side, the solder side, and the inner layer.

Therefore, the main plating line is formed on any one of the component side, the solder side, and the inner layer, so the PCB strip is desirably plated through the main plating line. Additionally, when the PCB strip is cut along the main plating line using a conventional sawing machine, the short does not occur.

Further, a semiconductor chip package is manufactured without the short even though an interval between the PCB units is reduced to 200 μm or less.

At this time, the plating process depends on where the main plating line is formed.

Figure 18:
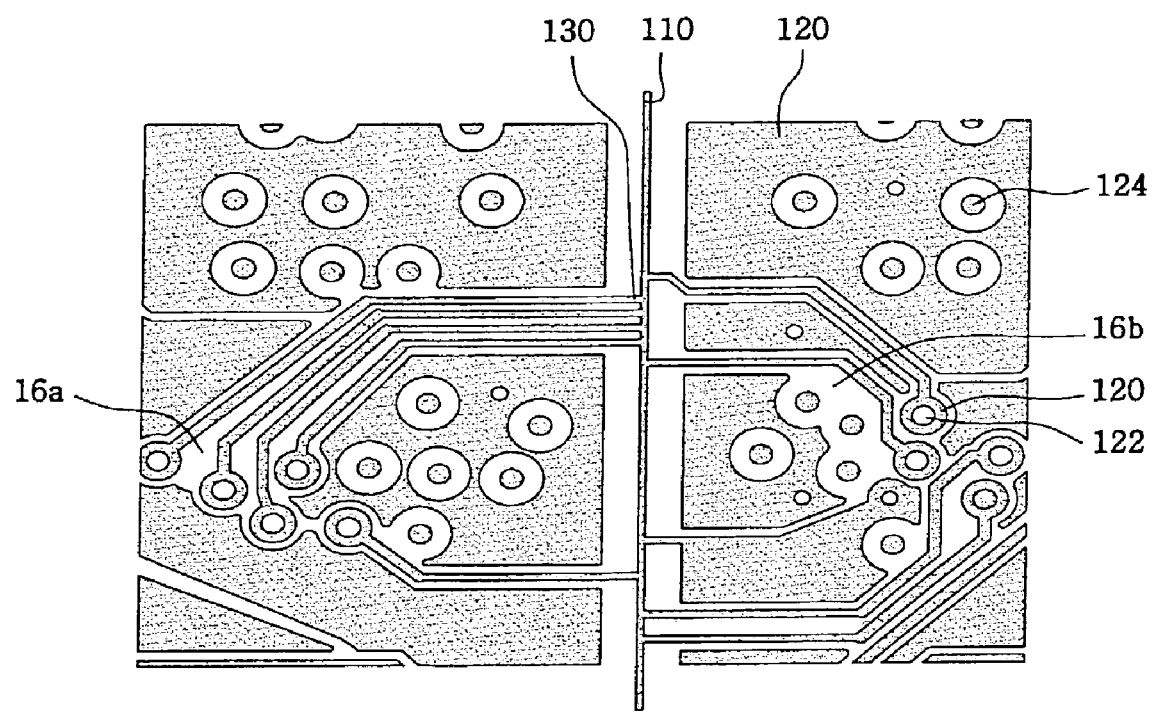

With reference to FIG. 18, an inner layer PCB unit inserted between the component side and the solder side is illustrated, in which the main plating line is not formed on the component and solder sides. When the main plating line 110 is formed between the PCB units 16a and 16b of the inner layer, sub-plating lines 130 are connected to the main plating line 110 to plate the PCB units 16a and 16b with Au. Particularly, the bond finger part of the component side and the solder ball part of the solder side are plated through the copper-clad part 120 including the conductive via land 122 of the inner layer.

Figure 19:
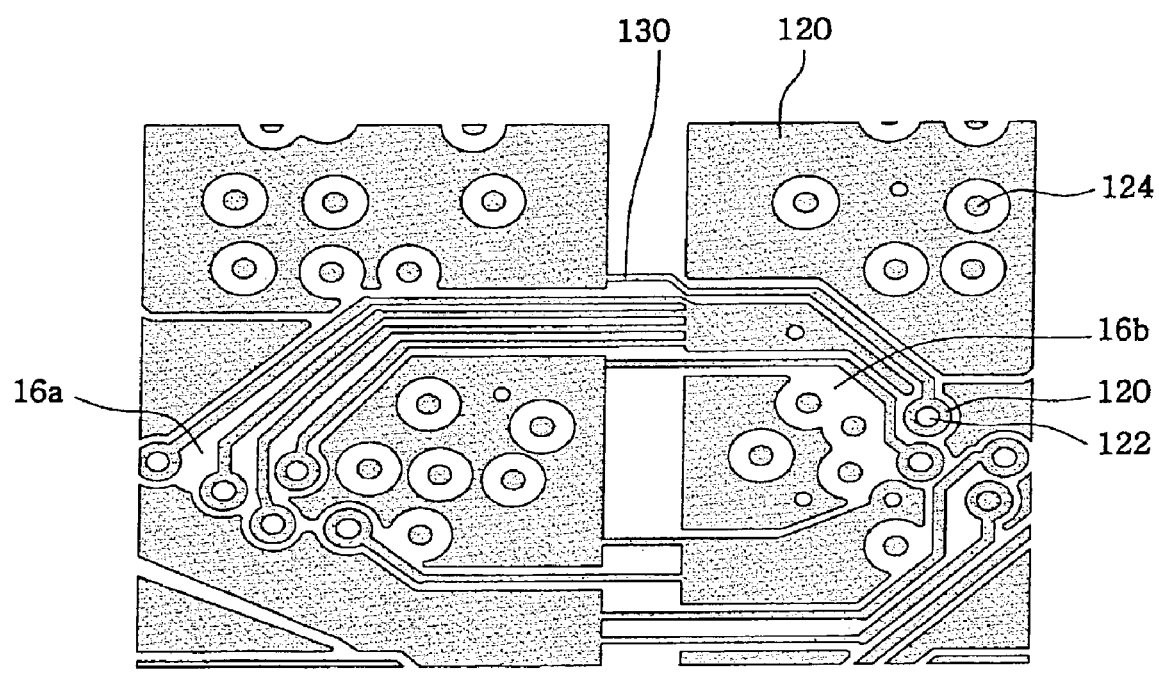

On the other hand, FIG. 19 illustrates another embodiment showing the inner PCB unit inserted between the component and solder side, in which the main plating line is not formed on the inner layer but on any one of the component side and the solder side. At this time, on the inner layer, the sub-plating lines 130 are connected to the copper-clad part 120. Particularly, a plurality of drill holes 124 are formed in the copper-clad part 120 connected to the sub-plating lines 130, thereby plating the PCB strip through the via land or the drill holes of the component or solder side.

Figure 20:
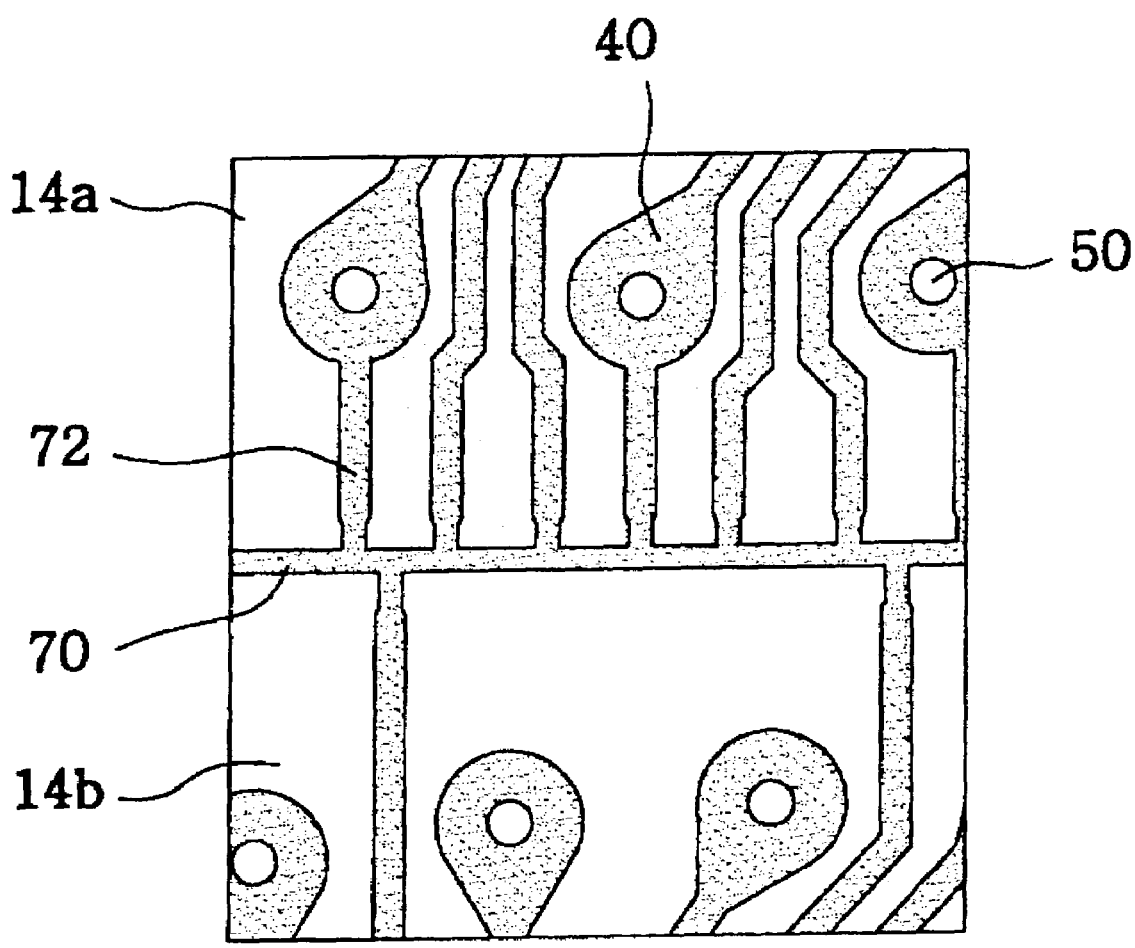
FIGS. 20 and 22 are enlarged views of a component side of a PCB strip of the present invention from which the main plating line is formed.
Figure 21:
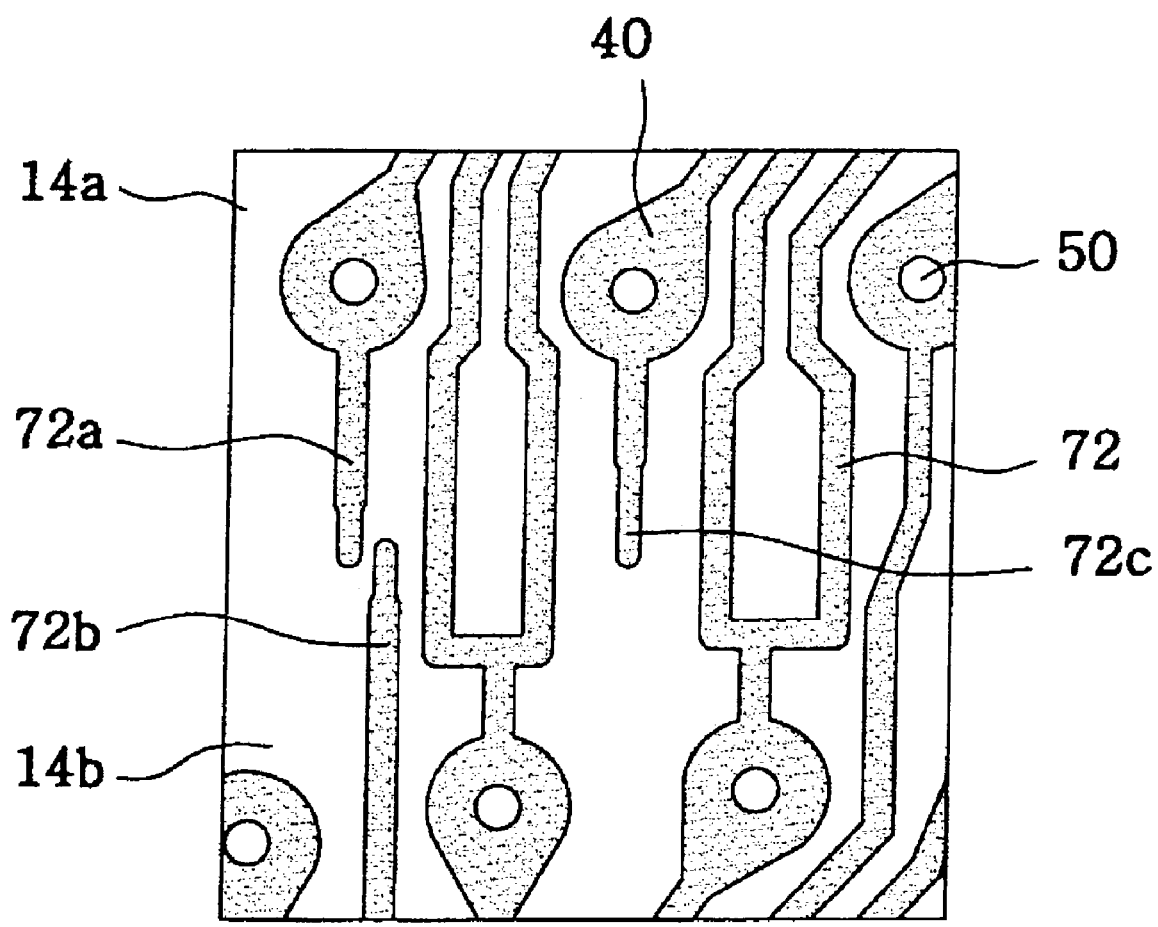
FIGS. 21 and 23 are enlarged views of the component side of the PCB strip of the present invention from which the main plating line is removed.

FIG. 20 is a partially enlarged view of the component side of the PCB strip, in which the main plating line 70 is formed between the PCB units 14a and 14b, and FIG. 21 is a partially enlarged view of the component side of the PCB strip without the main plating line 70. When the main plating line is not formed between the PCB units of the component side, the PCB strip is plated through the sub-plating line 72 and the via land 50 by connecting adjacent PCB units to each other. Accordingly, in FIG. 21, it is preferable that the sub-plating lines 72a, 72b, and 72c are designed so as to be connected to the copper-clad part including the via land.

Figure 22:
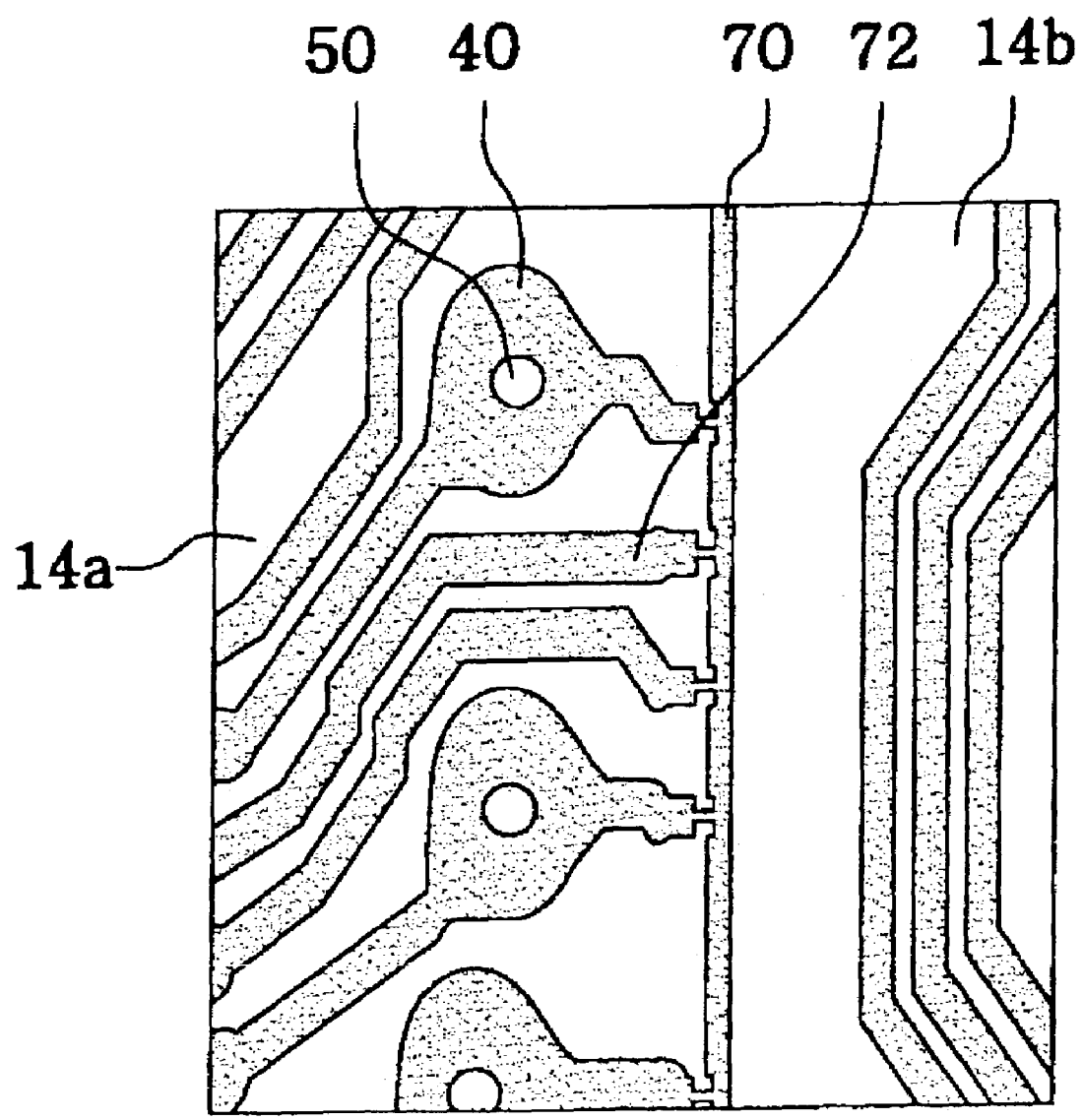
Figure 23:
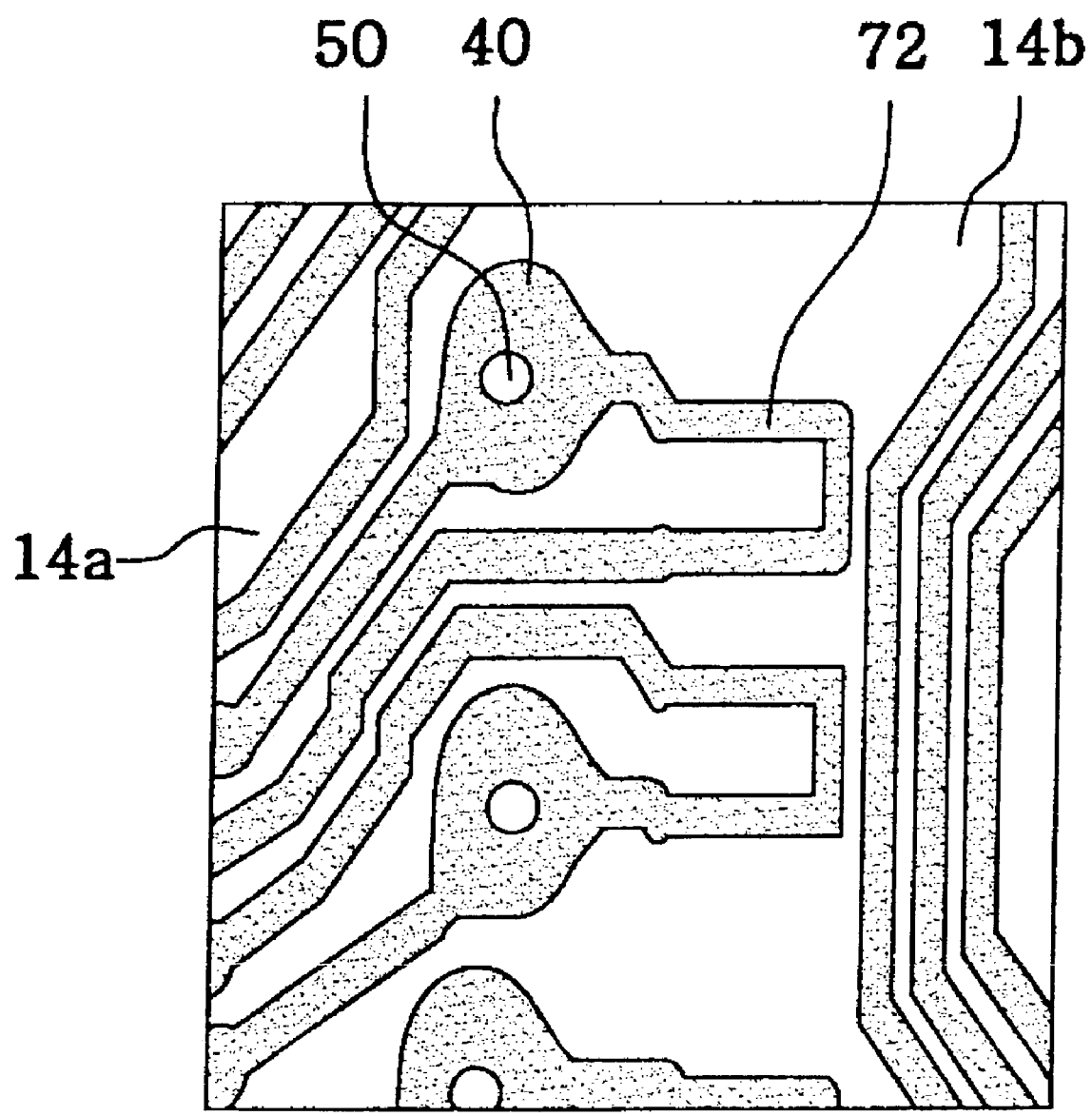

FIG. 22 is a partially enlarged view of the component side of the PCB strip, in which the main plating line 70 is formed between the PCB units 14a and 14b. At this time, the first PCB unit 14a is connected to the main plating line 70 but the second PCB unit 14b is not connected to the main plating line 70. Accordingly, when the main plating line is removed between the PCB units 14a and 14b of the component side as shown in FIG. 23, the sub-plating line 72 of the first PCB unit 14a is not connected to the second PCB unit 14b, thus being designed so as to be connected to the copper-clad part 40 including the via land 50 of the first PCB unit 14a.

Figure 24:
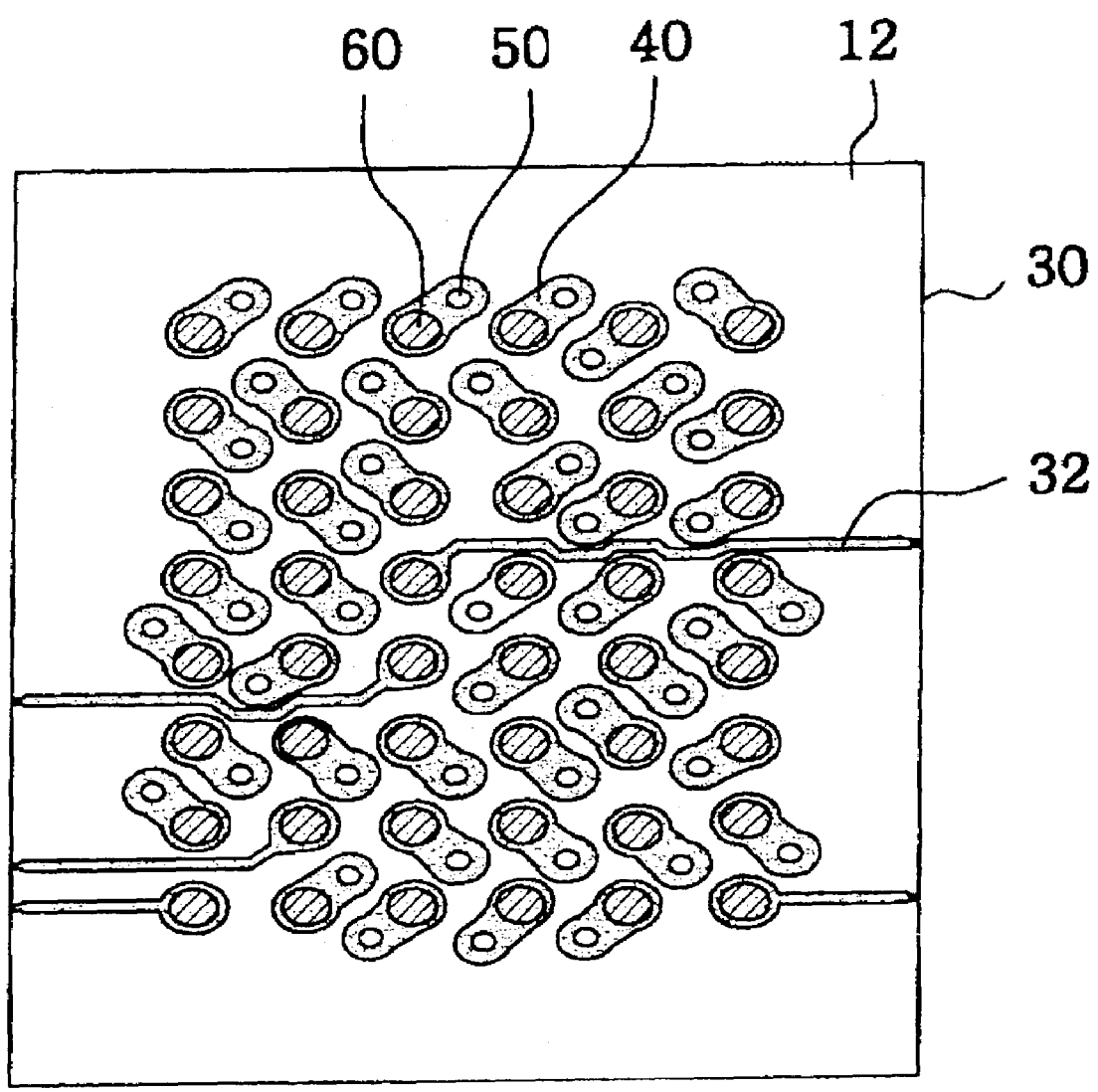
FIGS. 24 and 25 illustrate a solder side of a PCB strip of the present invention from which a solder ball part is connected to a sub-plating line.

FIG. 24 is a partially enlarged view of the solder side of the PCB strip, in which a solder ball part 60 only including a solder ball is connected through the sub-plating line 32 to the main plating line 30 or the copper-clad part at the outermost border of the PCB strip. At this time, the solder ball part 60 connected to the sub-plating line 32 is plated from the via land of the component side or the inner layer through the via land 50.

Figure 25:
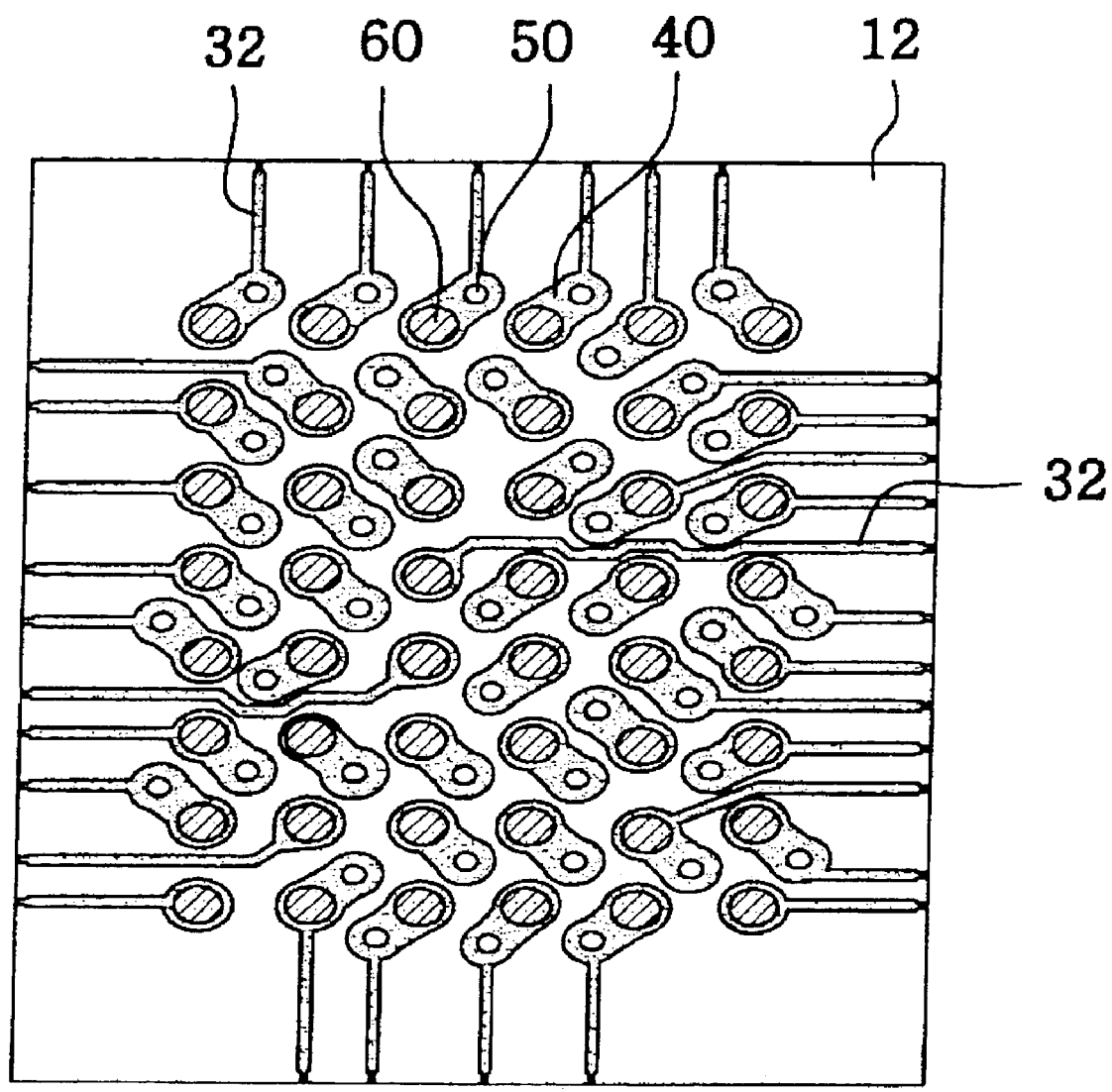

FIG. 25 is a partially enlarged view of the solder side of the PCB strip, in which the copper-clad part 40 of the solder ball part 60 including the solder ball is connected through the sub-plating line 32 to the main plating line 30 or the copper-clad part at the outermost border of the PCB strip. At this time, the sub-plating lines 32 are drawn from all the solder ball part 60 capable of being independently connected to the main plating line 30 or the copper-clad part at the outermost border of the PCB strip. The remaining solder ball part 60 not capable of being independently connected to the main plating line 30 or the copper-clad part at the outermost border of the PCB strip is plated through the via land 50 of the solder side, and the via land of the component side or the inner layer.

Figure 26:
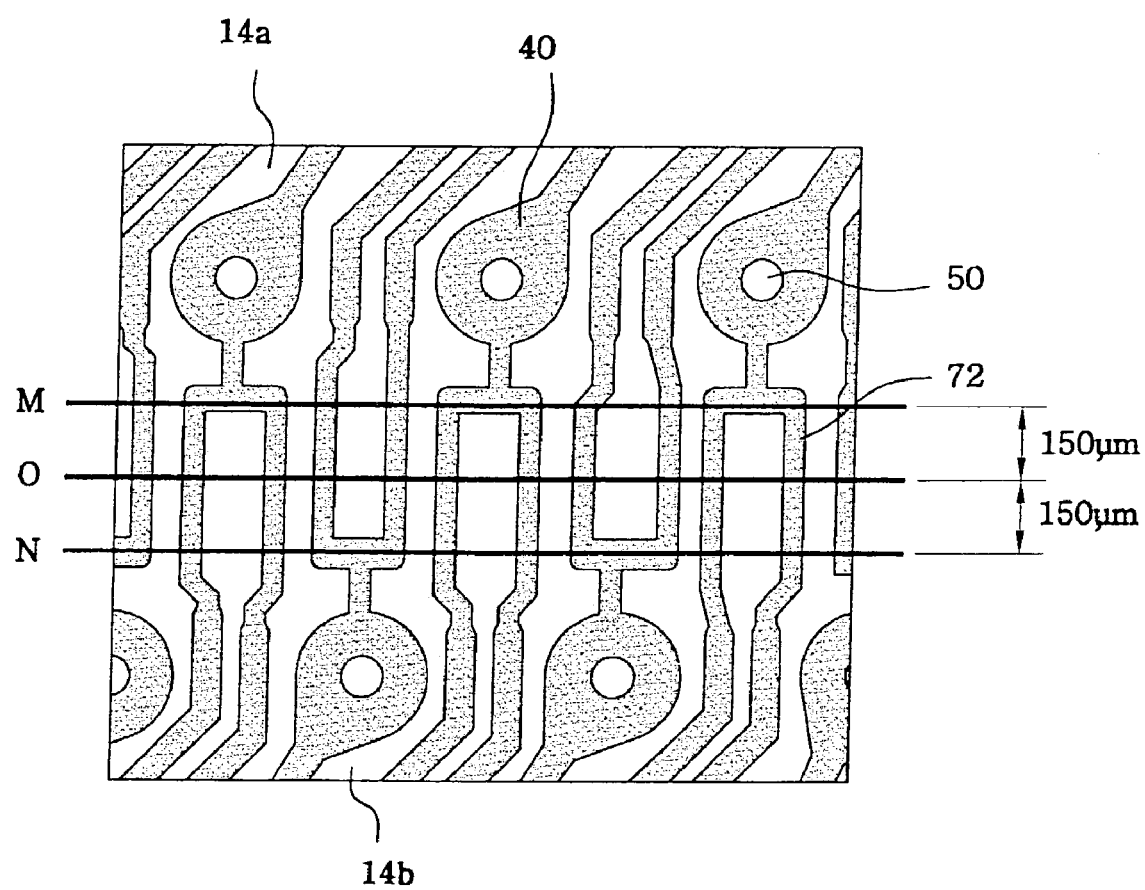
FIG. 26 is a partially enlarged view of a component side of a PCB strip of the present invention, which illustrates an allowable range occupied by the sub-plating line during designing the sub-plating line.

FIG. 26 is a partially enlarged view of the component side of the PCB strip, which illustrates the sub-plating line 72 connecting adjacent PCB units 14a, 14b to each other, and an allowable range occupied by the sub-plating line during designing the printed circuit pattern and the sub-plating line. In other words, a reference character M is a virtual upper limited line for drawing the sub-plating line, a reference character N is a virtual lower limited line for drawing the sub-plating line, and a reference character O is the main plating line formed between the PCB units. The plating line is drawn so as to avoid misalignment of the sub-plating lines of the component side, the solder side, and the inner layer, a distance between the main plating line O and the upper limited line M is within 150 μm, and a distance between the main plating line O and the lower limited line N is within 150 μm, thereby creating a zone for desirably drawing the sub-plating line.

Figure 27:
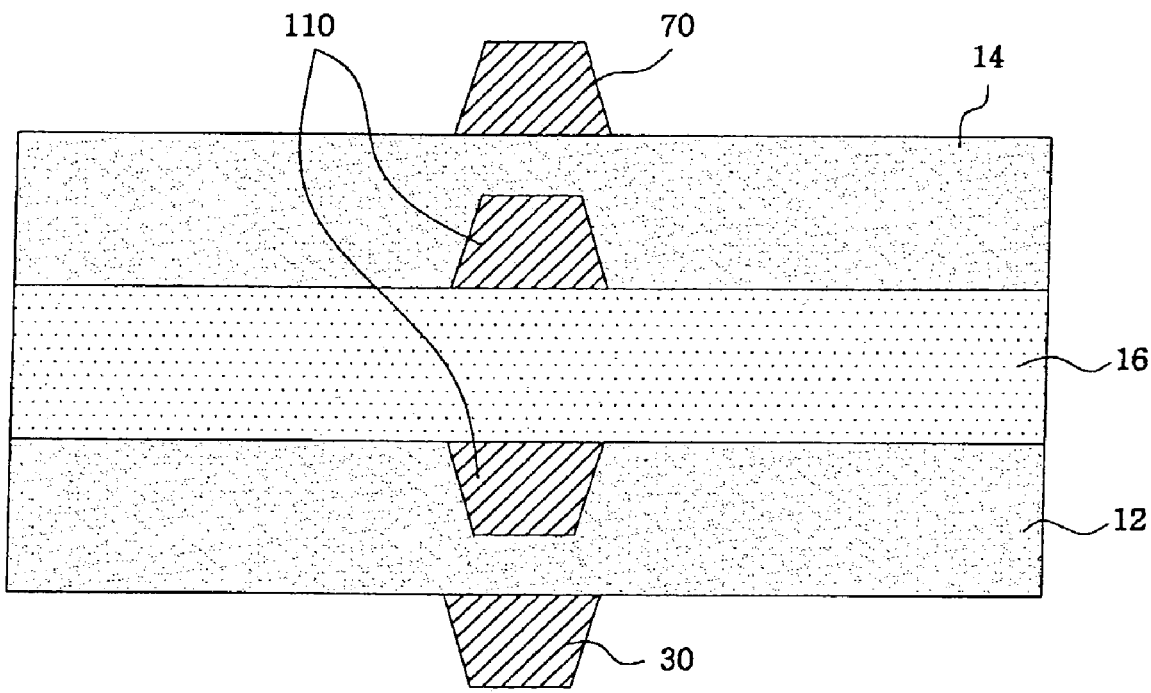
FIG. 27 is a schematic side view of a PCB strip, in which an inner layer is inserted between the component side and the solder side.

FIG. 27 is a schematic side view of the PCB strip, in which one or more inner layer is inserted between the component side 14 and the solder side 12. At this time, any one of the main plating lines 70, 30, 110, which is to be formed on the component side 14, the solder side 12, and the inner layer respectively, is optionally formed, thereby desirably plating the PCB strip through the main plating line and preventing a short when the PCB strip is cut along the main plating line using a conventional sawing machine.

Figure 28:
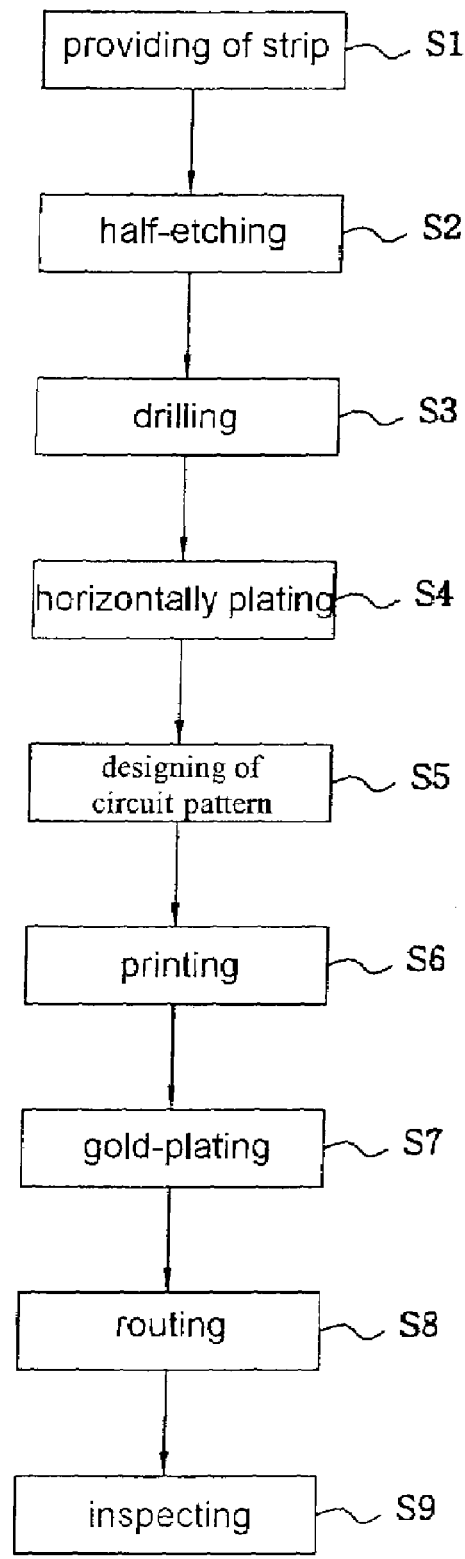
FIG. 28 is a flowchart illustrating fabrication of a semiconductor chip package using a design method for plating of the PCB strip according to the present invention.

FIG. 28 is a flowchart illustrating fabrication of a semiconductor chip package using a design method for plating of the PCB strip according to the present invention.

As in FIG. 28, the PCB strip including the component side and the solder side, or the PCB strip further including the inner layer is optionally prepared in operation S1.

The PCB strip is half-etched at a relatively low temperature for a relatively short time so as to obtain the PCB strip with a uniform etched surface and a constant thickness in operation S2.

The etched PCB strip is then drilled to form a plurality of holes at desired positions in operation S3, and horizontally plated in operation S4.

After a circuit pattern is designed on the plated PCB strip in operation S5, and the pattern is printed in operation S6. The printed strip is thereafter plated with gold in operation S7, and the gold-plated strip is then subjected to a routing process to form a plurality of grooves on the gold-plated strip in operation S8.

The resulting strip is inspected to estimate whether the PCB strip is inferior in quality thereof or not in operation S9, which ends the fabrication process of the semiconductor chip package. At this time, the design method for plating of the PCB strip according to the present invention is applied to steps of S5 to S7, thereby greatly reducing fabrication of inferior PCB strips.

According to the present invention, a manufacturing method of a semiconductor chip package comprises providing a printed circuit board strip (PCB strip) comprising a component side and a solder side, with a plurality of printed circuit board units (PCB units) arranged at regular intervals on the PCB strip and a main plating line optionally formed on the solder side or the component side. At this time, the component side have a bond finger part wire-bonded to first copper-clad parts for constructing a first circuit pattern, and the solder side have second copper-clad parts for constructing a second circuit pattern. Additionally, the solder ball parts are provided on the second copper-clad parts for receiving solder balls thereon, and the solder balls are melted and attached to the solder ball parts. The first and second copper-clad parts include conductive via lands. The manufacturing method also includes plating the solder ball parts of the solder side and the bond finger part of the component side through the main plating line or each of the via lands, mounting semiconductor chips on the component side of the plated PCB strip and wire-bonding the semiconductor chips to the PCB strip, trimming leads of the solder side and soldering the leads to the solder side, and cutting the resulting PCB strip along the main plating line of the solder side or the component side using a sawing machine without a short due to misalignment of the solder side from the component side.

Moreover, the present invention provides a manufacturing method of a semiconductor chip package, comprising providing a printed circuit board strip (PCB strip) comprising a component side and a solder side, with a plurality of printed circuit board units (PCB units) arranged at regular intervals on the PCB strip, one or more inner layer inserted between the component side and the solder side, and a main plating line optionally formed on the component side, the inner layer, or the solder side. The component side have a bond finger part wire-bonded to first copper-clad parts for constructing a first circuit pattern, and the solder side have second copper-clad parts for constructing a second circuit pattern and solder ball parts provided on the second copper-clad parts for receiving solder balls thereon. Additionally, the solder balls are melted and attached to the solder ball parts, the inner layer have third copper-clad parts for constructing a third circuit pattern, and the third copper-clad parts includes drill holes and being connected to a sub-plating line. The manufacturing method also includes plating the solder ball parts of the solder side and the bond finger part of the inner layer or the component side through the main plating line or each of the via lands, mounting semiconductor chips on the component side of the plated PCB strip and wire-bonding the semiconductor chips to the PCB strip, trimming leads of the solder side and soldering the leads to the solder side, and cutting the resulting PCB strip along the main plating line of the component side, the inner layer, or the solder side using a sawing machine without a short due to misalignment of the solder side with the component side.

Further, the present invention provides a semiconductor chip package manufactured by the method of manufacturing the semiconductor chip package using the design method for plating of the PCB strip.

Therefore, the present invention is advantageous in that an excellent semiconductor chip package is manufactured without a short when a PCB strip is cut using a sawing machine because misalignment of main plating lines of a solder side and a component side of the PCB strip is avoided. Other advantage of the present invention is that an interval between PCB units is reduced to desirably increase the number of PCB units in the PCB strip without the short when the PCB strip is cut because misalignment of the PCB strip is avoided.

It should also be understood that the foregoing relates to only the scope of the invention is defined by the appended claims rather than by the description preceding them, and all changes that fall within meets and bounds of the claims, or equivalence of such meets and bounds are therefore intended to be embraced by the claims.

What is claimed is:

1. A method of making a plurality of printed circuit board units (PCB units), comprising:
    forming a PCB strip having a solder side, a component side, and an inner layers disposed between said solder and said component side;
    forming a first circuitry pattern on said component side, said first circuit pattern being formed of first copper clad parts, first solder ball parts and first via conductive lands;
    forming a second circuitry pattern on said solder side, said second circuit pattern being formed of second copper clad parts, second solder ball parts and second via conductive lands;
    forming a third circuitry pattern on said inner layer, said third circuit pattern being formed of third copper clad parts, third solder ball parts and third via conductive lands, wherein said inner layer having through holes connected to the third via conductive lands and a sub-plating line connected to the third copper clad parts, said first, second and third patterns defining on said PCB strip a plurality of PCB units;
    wherein, said first copper-clad parts of said first circuit pattern being shaped and constructed to receive a plurality of components, each PCB unit having at least one component mounted thereon;
    said third copper-clad parts being formed with said via conductive lands being disposed around said through holes;
    wherein only one of said first, second and third circuit patterns includes a main plating line separating the PCB units; and
    cutting said PCB strip along said main plating line to separate said PCB units.

2. The method as set forth in claim 1, wherein said first, second and third circuit patterns are formed with an interval between the PCB units of no more then 200 μm.

3. The method as set forth in claim 1, wherein when the main plating line is formed between the PCB units on the solder side, further comprising forming sub-plating lines connecting said second copper-clad parts of adjacent PCB units wherein the first solder ball parts are plated through the main plating line, the component side includes bond finger parts that are plated through the third conductive via lands of the inner layer and the solder side, the solder ball parts of the solder side are plated through the third conductive via lands of the inner layer and second conductive via lands of the component side, and the inner layer is plated through the first conductive via lands of the solder side and the second via lands of the component side.

4. The method as setforth in claim 3, further comprising forming said first circuit pattern with said first copper-clad parts being provided at an outermost border of the solder side and being connected to the main plating line.

5. The method as set forth in claim 3, wherein the first and third copper-clad parts including the first and third conductive via lands in adjacent PCB units on the component side and the inner layer are not connected to each other through the sub-plating line, further comprising connecting the first and third copper-clad parts including the conductive via lands in each PCB unit on the inner layer and the component side to each other through the sub-plating line so that the PCB strip is plated through the main plating line of the solder side, and the first and third copper-clad parts and the sub-plating lines which are provided on the solder side, the inner layer and the component side of each PCB unit.

6. The method as set forth in claim 3, wherein the first solder ball parts of the solder side are plated through the first copper-clad parts provided at an outermost border of the solder side and the sub-plating lines by connecting the copper-clad parts including the solder ball parts or the conductive via lands to the copper-clad parts provided at the outermost border of the solder side through all the sub-plating lines directly connected to the copper-clad parts.

7. The method as set forth in claim 3, further comprising forming drill holes in said second copper-clad parts.

8. The method as set forth in claim 3, wherein said sub-plating line extends in a direction transversal to the main plating line.

9. The method as set forth in claim 3, further comprising providing each PCB units with copper-clad parts, and forming a plurality of sub-plating lines, each sub-plating line extending transversally to said main plating line between some but not all of the copper-clad parts of adjacent PCB units.

10. The method as set forth in claim 1, wherein the main plating line is only formed between PCB units on the inner layer, further comprising forming the first and second copper-clad parts including the conductive via lands in adjacent PCB units on the solder side and the component side with said first and second copper-clad parts being connected to each other through the sub-plating line so that the solder ball parts of the solder side and a bond finger part of the component side are plated through the main plating line and the second conductive via lands of the inner layer.

11. The method as set forth in claim 1, further comprising forming said main plating line on said inner layer, wherein third copper-clad parts provided at an outermost border of the inner layer are connected to the main plating line.

12. The method as set forth in claim 1, wherein the main plating line is formed on said inner layer and sub-plating lines are formed on the outer layer and wherein the first and second copper-clad parts including the first and second conductive via lands in adjacent PCB units on the solder side and the component side are not connected to each other through the sub-plating line, the first and second copper-clad parts including the first and conductive via lands in each PCB unit on the solder side and the component side are connected to each other through the sub-plating line so that the PCB strip is plated through the main plating line of the inner layer.

13. The method as set forth in claim 1, wherein when the main plating line is formed only between the PCB units on the component side, further comprising forming sub-plating lines on said solder side the copper-clad parts including the conductive via lands in adjacent PCB units on the solder side and the inner layer are connected to each other through the sub-plating line so that the PCB strip is plated through the main plating line of the component side, and the copper-clad parts and the sub-plating lines which are provided on the solder side and the inner layer of the PCB unit.

14. The method as set forth in claim 13, wherein the copper-clad pparts provided at an outermost border of the component side are connected to the main plating line.

15. The method as set forth in claim 13, wherein the copper-clad parts including the conductive via lands in adjacent PCB units on the solder side and the inner layer are not connected to each other through the sub-plating line, further comprising connecting the copper-clad parts including the conductive via lands in each PCB unit on the solder side and the inner layer to each other through the sub-plating line so that the PCB strip is plated through the main plating line of the component side, and the copper-clad parts and the sub-plating lines which are provided on the solder side, the inner layer and the component side of each PCB unit.

16. The method as set forth in claim 13, wherein, further comprising connecting the copper-clad parts including drill holes on the inner layer of one PCB unit through the sub-plating line to the conductive via lands on the inner layer of another PCB unit neighboring with the PCB unit having the drill holes.

17. The method as set forth in claim 1, wherein the first or second copper-clad parts including the conductive via lands in each PCB unit on any one side of the component side and the solder side without the main plating line are connected to the sub-plating line, further comprising forming the sub-plating line so as to prevent misalignment of the component side from the solder side, said sub-plating line being determined to have an allowable interval of 150 µm or less above and below or left and right a virtual main plating line.

18. A method of making a plurality of printed circuit board units (PCB units), comprising:

forming the PCB strip with a component layer, a solder layer and an inner layer with drill holes;

depositing a component circuit pattern on said component layer;

depositing a solder circuit pattern on said solder layer;

depositing an inner layer circuit pattern on said inner layer, wherein, said each component, solder and inner layer circuit patterns being shaped to define a plurality of adjacent superimposed PCB units on each layer, said PCB units being separated by imaginary lines and with an electronic component being mounted on each PCB unit on said component layer said component circuit pattern including bond fingers adapted to contact said electronic components;

said solder circuit pattern including solder ball parts, solder component-clad pads and solder conductive via lands;

said inner circuit pattern including inner conductor via lands formed around said drill holes;

said component circuit pattern being formed with component sub-plating lines between said bond fingers of adjacent PCB units;

said solder circuit pattern being formed with solder sub-plating lines between-said solder ball parts of adjacent PCB units; and said inner circuit pattern being formed with inner sub-plating lines between said conductive via lands of adjacent PCB units, wherein, said imaginary lines defined within upper and lower limited lines of the sub plating lines in layers;

connecting the sub-plating line to the copper-clad parts at an outermost board of each PCB unit; and plating the solder ball parts of the solder circuit pattern and the bond finger part of the component side through the sub-plating line and the copper-clad parts including the conductive via lands; and cutting said PCB strip along the imaginary lines to separate said PCB units.

19. The method as set forth in claim 18, wherein said PCB strip is formed without any main plating lines separating said PCB units.

* * * * *